US 9,159,765 B2

(12) United States Patent
Totsuka

(10) Patent No.: US 9,159,765 B2
(45) Date of Patent: Oct. 13, 2015

(54) APPARATUS FOR DETECTING SOFT X-RAY RADIATION AND X-RAY DETECTION SYSTEM INCLUDING SUCH APPARATUS

(75) Inventor: Hirofumi Totsuka, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 558 days.

(21) Appl. No.: 13/565,178

(22) Filed: Aug. 2, 2012

(65) Prior Publication Data

US 2013/0032726 A1 Feb. 7, 2013

(30) Foreign Application Priority Data

Aug. 5, 2011 (JP) .................. 2011-171972

(51) Int. Cl.
*G01T 1/24* (2006.01)
*H01L 27/146* (2006.01)

(52) U.S. Cl.
CPC .......... *H01L 27/14659* (2013.01); *G01T 1/247* (2013.01); *H01L 27/14663* (2013.01)

(58) Field of Classification Search
CPC .............. G01T 1/247; H01L 27/14659; H01L 27/14663
See application file for complete search history.

(56) References Cited

U.S. PATENT DOCUMENTS 6,316,814 B1   11/2001  Nagata et al.
7,145,986 B2 * 12/2006  Wear et al. .................. 378/98.8

FOREIGN PATENT DOCUMENTS

| EP | 862219 A2 | 9/1998 |
| EP | 954032 A2 | 11/1999 |
| EP | 1763222 A2 | 3/2007 |
| EP | 2309541 A2 | 4/2011 |
| JP | S61-283172 A | 12/1986 |
| JP | 2006024907 A | 1/2006 |
| JP | 2007-527500 A | 9/2007 |
| WO | 0219429 A2 | 3/2002 |

* cited by examiner

*Primary Examiner* — Yara B Green
(74) *Attorney, Agent, or Firm* — Canon USA Inc. IP Division

(57) ABSTRACT

A soft X-ray detection apparatus includes a semiconductor substrate. The semiconductor substrate has a plurality of detection units disposed thereon, each including a conversion unit and a circuit unit. The conversion unit is formed from, for example, a photodiode. The conversion unit collects electric charge generated upon incidence of soft X-ray radiation. A first conductive type (e.g., N-channel type) amplifier transistor is disposed in the circuit unit. The amplifier transistor serves as an amplifier unit that amplifies and outputs a signal supplied from the conversion unit. A first conductive type transistor is not disposed between the conversion units that are immediately adjacent to each other. Alternatively, transistors included in the detection units that are immediately adjacent to each other are disposed so as to be in close proximity to each other.

18 Claims, 14 Drawing Sheets

APPARATUS FOR DETECTING SOFT X-RAY RADIATION AND X-RAY DETECTION SYSTEM INCLUDING SUCH APPARATUS

BACKGROUND

1. Field of the Invention

Embodiments of the present invention relate to an X-ray detection apparatus configured to detect soft X-ray radiation.

2. Description of the Related Art

A solid-state image pickup device including an amplifier unit for each pixel is known to the present inventors. Japanese Patent Laid-Open No. 2006-024907 describes a solid-state image pickup device having a plurality of pixels. Each of the pixels includes a photodiode and a source follower metal-oxide-semiconductor (MOS) transistor serving as part of an amplifier circuit. In the solid-state image pickup device described in Japanese Patent Laid-Open No. 2006-024907, a photodiode and a source follower MOS transistor are disposed on a single semiconductor substrate.

The solid-state image pickup device disclosed by Japanese Patent Laid-Open No. 2006-024907 operates exclusively in the visible light range of the electromagnetic spectrum. However, Japanese Patent Laid-Open No. 2006-024907 does not discuss detection of soft X-ray radiation.

SUMMARY

In contrast, the present inventors discovered that soft X-ray radiation can be accurately detected by using a detection apparatus comprising a plurality of detection units, each detection unit including a conversion unit that converts soft X-ray radiation into electric charge and a circuit unit, such as an amplifier unit and by appropriately determining the layout of the plurality of detection units.

Accordingly, embodiments of the present invention provides the layout of a detection unit capable of accurately detecting soft X-ray radiation in a soft X-ray detection apparatus including an amplifier unit that amplifies a signal generated by a conversion unit.

According to an embodiment of the present invention, a soft X-ray detection apparatus includes a semiconductor substrate and a plurality of detection units disposed on the semiconductor substrate. Each of the detection units includes a first conductive type semiconductor region that is disposed in the semiconductor substrate and that collects electric charge generated upon incidence of soft X-ray radiation, and a readout circuit including at least an amplifier transistor that outputs a signal based on the electric charge collected by the semiconductor region. The first conductive type transistor included in the readout circuit is not disposed between every pair of the semiconductor regions that are immediately adjacent to each other, and a first isolation unit is disposed between the pair of the semiconductor regions so that the two semiconductor regions are electrically separated from each other.

According to another embodiment of the present invention, a soft X-ray detection apparatus includes a semiconductor substrate and first and second detection units disposed on the semiconductor substrate. Each of the first and second detection units includes a first conductive type semiconductor region that is disposed in the semiconductor substrate and that collects electric charge generated upon incidence of soft X-ray radiation, and a plurality of first conductive type transistors including an amplifier transistor that outputs a signal based on the electric charge collected by the semiconductor region. The first detection unit and the second detection unit are disposed so as to be immediately adjacent to each other, and any one of the first conductive type transistors included in the first detection unit and any one of the first conductive type transistors included in the second detection unit are disposed so that a distance therebetween is less than a first distance.

According to still another embodiment of the present invention, a soft X-ray detection apparatus includes a semiconductor substrate and first and second detection units disposed on the semiconductor substrate. Each of the first and second detection units includes a first conductive type semiconductor region that is disposed in the semiconductor substrate and that collects electric charge generated upon incidence of soft X-ray radiation, and a plurality of first conductive type transistors including an amplifier transistor that outputs a signal based on the electric charge collected by the semiconductor region. The first detection unit and the second detection unit are disposed so as to be immediately adjacent to each other, and the semiconductor region included in the first detection unit is disposed so that a distance between the semiconductor region included in the first detection unit and each of the first conductive type transistors included in the second detection unit is greater than a second distance.

According to the above-described embodiments, the soft X-ray detection apparatus can accurately detect soft X-ray radiation.

Further features of the present invention will become apparent from the following description of exemplary embodiments with reference to the attached drawings.

DESCRIPTION OF THE EMBODIMENTS

Figure 1:
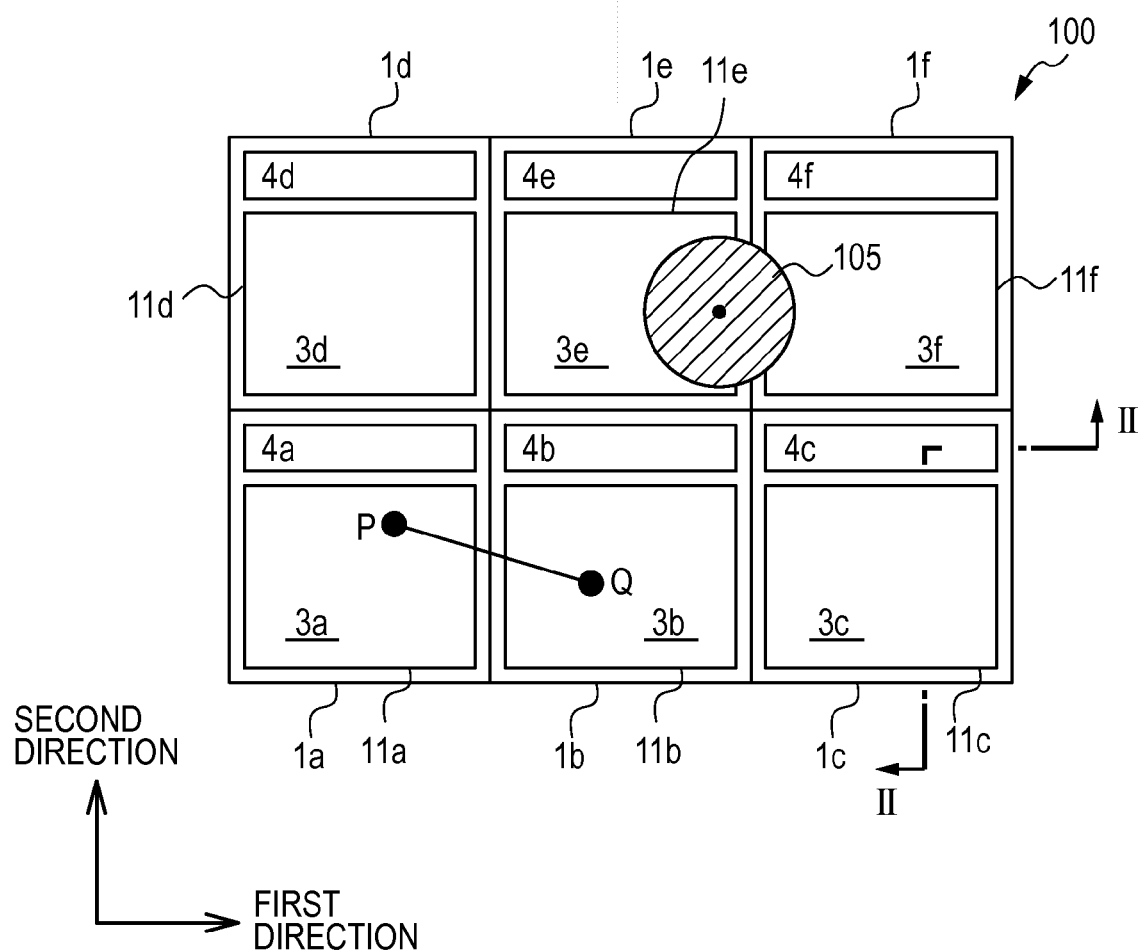
FIG. 1 is a schematic illustration of the planar structure of a soft X-ray detection apparatus according to a first exemplary embodiment of the present invention.

A main portion of a soft X-ray detection apparatus 100 according to an exemplary embodiment of the present invention is described below with reference to FIGS. 1 and 2. X-ray radiation is at the short wavelength, high-energy end, of the electromagnetic spectrum. It is convenient to describe X-rays in terms of the energy they carry, i.e., in units of thousands of electronvolts (keV). X-rays have energies ranging from less than 1 keV to greater than 100 keV. X-rays having up to 10 keV (10 to 0.10 nm wavelength) are typically classified as soft X-rays, while hard X-rays are typically those with energies greater than around 10 keV. However, the distinction between hard and soft X-rays is not well defined. More relevant to the distinction of X-rays are the penetrating ability of the radiation, the instruments required to observe them, and the physical conditions under which the X-rays are produced. As illustrated in FIG. 1, the soft X-ray detection apparatus 100 includes a plurality of detection units 1. In FIG. 1, six detection units 1a to 1f are illustrated. The plurality of the detection units 1 are disposed on a semiconductor substrate 2 (refer to FIG. 2).

In this description, if a plurality of elements included in different detection units have the same function, the elements have reference symbols including the same number. When, for these elements having the same function, an item common to the plurality of detection units is described, a reference symbol including only a number is used. However, if the elements having the same function are described for each of the detection units as a different element, a number with a letter suffix is used as a reference symbol.

Each of the detection units 1 includes a conversion unit 3 and a circuit unit 4. The conversion unit 3 is formed from, for example, a photodiode. As illustrated in FIG. 2, the conversion unit 3 includes a first conductive type (e.g., N-type) semiconductor region 11 disposed therein. Soft X-ray radiation (a first soft X-ray 101 and a second soft X-ray 103) is mainly incident on the conversion unit 3 of the semiconductor substrate 2. Electric charge generated upon incidence of the soft X-ray radiation onto the semiconductor substrate 2 is collected in the semiconductor region 11.

The circuit unit 4 has a first conductive type (e.g., N-type) transistor disposed therein. The first conductive transistor forms a readout circuit. As illustrated in FIG. 2, the readout circuit includes an amplifier transistor 6 that amplifies the signal generated in the conversion unit 3. The amplifier transistor 6 forms the amplifier unit that outputs a signal based on the electric charge generated by the conversion unit 3.

In this way, according to the present exemplary embodiment, the soft X-ray detection apparatus 100 includes a plurality of detection units each including the first conductive type semiconductor region 11 and the amplifier transistor 6. The embodiment of the present invention is characterized by a positional relationship between the first conductive type semiconductor region 11 disposed in the conversion unit 3 and the first conductive type transistor (e.g., the amplifier transistor 6) disposed in the circuit unit 4. More specifically, the embodiment of the present invention provides at least one of the following first to third features.

The first feature is that a first conductive type transistor is not disposed between a first conductive type semiconductor region 11a and a first conductive type semiconductor region 11b that are immediately adjacent to each other. Instead, an isolation unit that electrically separates the first conductive type semiconductor region 11a from the first conductive type semiconductor region 11b is disposed.

The first feature indicating that a transistor is not disposed between the semiconductor region 11a and the semiconductor region 11b is described next. Let PQ be an imaginary line extending between a point P inside the semiconductor region 11a of a conversion unit 3a and a point Q inside the semiconductor region 11b of the conversion unit 3b. Then, if a region of the circuit unit 4 having a transistor therein contains part of the line PQ, the transistor is located between the semiconductor region 11a and the semiconductor region 11b. However, if the region having a transistor therein does not contain part of the line PQ, a transistor is not located between the semiconductor region 11a and the semiconductor region 11b.

As used herein, the term "region having a transistor therein" refers to a region containing a semiconductor region forming an electrode of the transistor or a semiconductor region forming a channel. For example, an MOS transistor region is formed from a source region, a drain region, and a channel region. As another example, a bipolar transistor region is formed from a collector region, a base region, and an emitter region. Furthermore, another semiconductor region electrically connected to the semiconductor region serving as an electrode of the transistor can be included in the transistor region. For example, if a semiconductor region to which power is supplied is electrically connected to the drain region of a MOS transistor, the semiconductor region is included in the transistor region. However, a region that does not contain the above-described semiconductor region and that contains only the gate electrode of the MOS transistor or a metal wire connected to the transistor is not included in the transistor region.

In particular, it is important that a region having a conductive type that is the same as the conductive type of the first conductive type semiconductor region 11 should not be located between two semiconductor regions 11. In general, many transistors are configured so as to include a P-type semiconductor region and an N-type semiconductor region. In this case, only a P-type semiconductor region having a type opposite to the N-type may be disposed between two N-type semiconductor regions 11.

The isolation unit disposed between the semiconductor region 11a and the semiconductor region 11b performs separation using an insulating film, such as LOCOS or STI, a semiconductor region having a conductive type that is opposite to the conductive type of the semiconductor region 11 (e.g., a P-type), or a combination thereof. Alternatively, any existing separation technique can be employed.

In FIG. 1, the circuit unit 4 is not disposed between a conversion unit 3b and a conversion unit 3c, between a conversion unit 3d and a conversion unit 3e, and between a conversion unit 3e and a conversion unit 3f. However, it is only required that a first conductive type transistor included in the circuit unit 4 is not disposed between at least one pair of the conversion units 3 that are immediately adjacent to each other and an isolation unit is disposed between the pair of the conversion units 3.

Note that when the semiconductor region 11a and the semiconductor region 11b are adjacent to each other, the semiconductor region 11a and the semiconductor region 11b need not be continuous without a gap therebetween.

The second feature indicates that the distance between any one of a plurality of the first conductive type transistors included in a circuit unit 4a of the detection unit 1a and any one of a plurality of the first conductive type transistors included in a circuit unit 4b of the detection unit 1b that is adjacent to the detection unit 1a is less than a first distance d.

The first distance d is determined on the basis of the size of a region 102 in which an electron is generated when a photon of the soft X-ray is incident on the region 102 (a "charge generation region" described below). For example, the first distance d can be determined so as to be equal to the diameter of the smallest sphere that encloses the region 102 in which an electron is generated when a photon of the soft X-ray is incident on the semiconductor substrate 2. Alternatively, if the semiconductor substrate 2 is a silicon substrate, the first distance d can be determined so as to be 1.0 micrometer. Still alternatively, the first distance d (micrometer) may be determined as follows:

$$d = 1.71 \times E^{\frac{7}{4}} \times 10^{-2} \quad (1)$$

where E (keV) denotes the energy of the incident soft X-ray.

The third feature indicates that the distance between the first conductive type semiconductor region 11a included in the conversion unit 3 of the detection unit 1a and each of a plurality of the first conductive type transistors included in the circuit unit 4 of the detection unit 1d that is adjacent to the detection unit 1a is greater than a second distance r.

The second distance r is determined by the size of a region 102 (a "charge generation region" described below) in which an electron is generated when a photon of the soft X-ray is incident on the region 102. For example, the second distance r can be determined so as to be equal to the radius of the smallest sphere that encloses the region 102 in which an electron is generated when a photon of the soft X-ray is incident on the region 102. Alternatively, if the semiconductor substrate 2 is a silicon substrate, the second distance r can be determined so as to be 0.5 micrometer. Still alternatively, the second distance r (micrometer) may be determined as follows:

$$r = 0.85 \times E^{\frac{7}{4}} \times 10^{-2} \quad (2)$$

where E (keV) denotes the energy of the incident soft X-ray.

The features of the embodiments of the present invention have been described with reference to an example of the detection unit 1 including the conversion unit 3, the circuit unit 4, and the first conductive type semiconductor region 11 disposed in the conversion unit 3. The detection units 1 may further include a charge holding unit. The charge holding unit includes the first conductive type (e.g., N-type) semiconductor region that collects electric charge generated by the conversion unit 3 and holds the electric charge.

If the detection unit 1 includes the charge holding unit, it is desirable that a first conductive type transistor not be disposed between the first conductive type semiconductor region included in the charge holding unit and the first conductive type semiconductor region 11 included in the conversion unit 3.

An advantage of embodiments of the present invention are described next. According to embodiments of the present invention, by reading, in the form of a signal, electric charge generated upon incidence of soft X-ray radiation onto the semiconductor substrate 2, the soft X-ray can be detected. For example, by reading almost all or nearly all of the electric charge generated by a single photon of soft X-ray radiation in the form of a signal, the energy of the detected soft X-ray can be accurately measured.

At that time, by reducing the probability of reading only part of the generated electric charge in the form of a signal, the accuracy of the measurement of the energy of the soft X-ray can be increased. Such an advantage is described in more detail below.

Note that as the signal, only one of an electron and a positive hole can be read depending on the conductive type of conversion unit (e.g., a photodiode). In the following description, an electron is considered as a signal carrier. Alternatively, a positive hole may be considered as a signal carrier. Still alternatively, both an electron and a positive hole may be read as signal carriers.

Measurement of the energy of soft X-ray radiation (i.e., photon counting) is described first. In FIG. 2, if soft X-ray radiation is incident on the semiconductor substrate 2, a plurality of electron-hole pairs are generated. For example, soft X-ray radiation incident on the semiconductor substrate 2 ionizes electrons in an atom that forms the semiconductor substrate 2 (e.g., a silicon atom).

The number of the generated electron-hole pairs varies with the energy of the incident soft X-ray. For example, if the semiconductor substrate 2 is a silicon substrate, the number of the generated electron-hole pairs can be obtained by dividing the energy of the incident soft X-ray by the average ionization energy of silicon. When, for example, the average ionization energy of silicon is 3.65 eV (electron volt) and if the incident soft X-ray has an energy of 1 keV, about 270 electron-hole pairs are generated. As the energy of an incident soft X-ray increases, the number of generated electron-hole pairs increases.

Accordingly, the detection unit is configured so that the average number of soft X-ray photons incident on the detection unit is less than or equal to one. Thereafter, by reading a signal obtained in accordance with the number of generated electrons, the energy of the incident soft X-ray can be accurately measured. More specifically, assume that when one soft X-ray photon is incident on the soft X-ray detection apparatus, one of the detection units 1 outputs a signal that is equivalent to 270 electrons. Then, as described above, an energy of 3.65 eV is necessary for generating one electron. Accordingly, the calculated energy of the incident soft X-ray is about 1 keV (270 times 3.65 eV). In addition, assume that a signal that is equivalent to 540 electrons is output from one of the detection units 1. In such a case, the calculated energy of the incident soft X-ray is about 2 keV (540 times 3.65 eV).

The case where, unlike the above-described cases, the energy of soft X-ray radiation is not accurately measured is described next. For example, the case in which one soft X-ray photon having an energy of 2 keV is incident on one of the detection units 1 and 540 electrons are generated is discussed. If all of the 540 electrons can be read in the form of a signal, the energy of the incident soft X-ray radiation can be accurately measured, as described above. However, if, for some reason, a signal that is equivalent to 270 electrons is output from the detection unit 1, the energy of the soft X-ray radiation computed on the basis of the output signal is 1 keV (270 times 3.65 eV). That is, although the incident soft X-ray radiation has an energy of 2 keV, the result of the measurement indicates that the energy of the incident soft X-ray radiation is 1 keV. As described above, in some cases, the energy of soft X-ray radiation is not accurately measured.

One reason why a signal equivalent to only some of the generated electrons is output is that part of generated electric charge is discharged to a region other than a detection node. Such a problem occurs only on detection of soft X-ray radiation that generates a plurality of electrons for one incident photon. A mechanism by which some of the generated electrons are discharged on detection of soft X-ray radiation is described in more detail below.

When soft X-ray radiation is incident on some region, a plurality of electrons are generated in a region that is spatially wider than the region which soft X-ray photons hit. If the energy of the incident soft X-ray radiation is several keV, the region in which electrons are generated can extend to a several-micrometer region in the semiconductor substrate 2. That is, a plurality of electrons are not generated at one point in the semiconductor substrate, but are generated at a plurality of different points. For descriptive purposes, the three-dimensional region in which a plurality of electrons are generated is referred to as a "charge generation region".

The location of the charge generation region varies with a point at which the soft X-ray radiation is incident. In addition, the size of the charge generation region may vary with the energy of the soft X-ray radiation. For example, the charge generation region can be approximated by a sphere having a diameter d given by equation (1). In such a case, as indicated by equation (1), as the energy E of the soft X-ray radiation increases, the diameter d increases. Examples of the charge generation region are illustrated as the region 102 and a region 104 illustrated in FIG. 2.

The number of electrons that are read as a signal and the number of electrons that are discharged are determined by the location of the charge generation region in the detection unit 1 of the soft X-ray detection apparatus, that is, by the position at which the soft X-ray radiation is incident on the detection unit 1. The reason is described next with reference to FIGS. 12A to 12C.

Figure 12A:
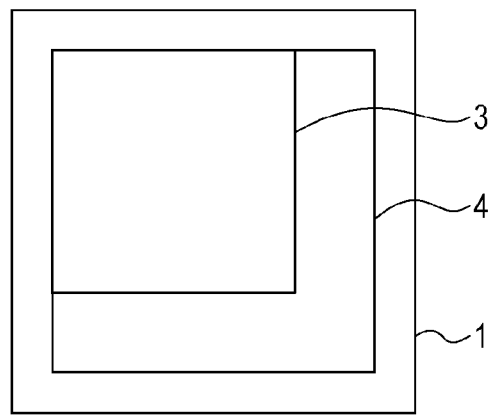
FIG. 12A is a schematic illustration of the planar structure of a detection unit of a soft X-ray detection apparatus.
Figure 12B:
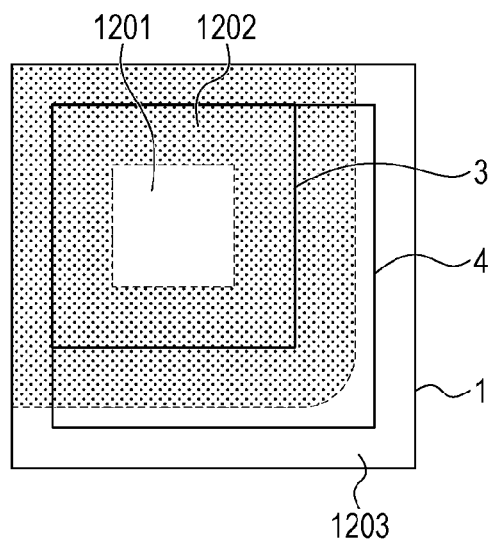
FIG. 12B is a schematic illustration of the planar structure of a detection unit of a soft X-ray detection apparatus.

FIG. 12A illustrates the detection unit 1 of the soft X-ray detection apparatus. The detection unit 1 has the conversion unit 3 and the circuit unit 4 disposed therein. In FIG. 12B, the detection unit 1 illustrated in FIG. 12A is partitioned into three regions 1201 to 1203, for descriptive purposes.

The first region 1201 is located in substantially the middle of the conversion unit 3. If soft X-ray radiation is incident in the first region 1201, all generated electrons are collected by the conversion unit 3. This is because although electric charge is generated at a position distant from the position at which the soft X-ray radiation is incident, the position is still inside the conversion unit 3. That is, since the entirety of the charge generation region is located inside the conversion unit 3, all of the generated electrons can be collected by the conversion unit 3 and can be read. Therefore, if soft X-ray radiation is incident in the first region 1201, the energy of the soft X-ray radiation can be accurately measured.

In FIG. 12B, the second region 1202 is indicated by hatching. The second region 1202 includes the outer area of the conversion unit 3 and part of the region of the circuit unit 4. If soft X-ray radiation is incident in the second region 1202, some of the electrons may be collected by the conversion unit 3 and the other electrons may be discharged to the circuit unit 4. This is because the charge generation region extends across both the conversion unit 3 and the circuit unit 4. In such a case, the readout signal is equivalent to only some of the generated electrons. Accordingly, if soft X-ray radiation is incident in the second region 1202, it is difficult to accurately measure the energy of the soft X-ray radiation.

The third region 1203 is sufficiently distant from the conversion unit 3. If soft X-ray radiation is incident in the third region 1203, all of the generated electrons are discharged. This is because the charge generation region does not extend to the conversion unit 3. Accordingly, if soft X-ray radiation is incident in the third region 1203, the soft X-ray is negligibly detected.

Which one of the first region 1201 to the third region 1203 receives the incident soft X-ray radiation is determined by the statistical probability in accordance with the ratio among the areas of the first region 1201 to the third region 1203. More specifically, assume that the areas of the first region 1201 to the third region 1203 are in the ratio of 1:6:3. Detection of soft X-ray radiation in which one photon is incident on the detection unit 1 is performed 1000 times using the soft X-ray detection apparatus having such a ratio. In this case, soft X-ray radiation is incident in the first region 1201 about 100 times and, therefore, a signal that accurately indicates the energy of the soft X-ray radiation is output each time. Soft X-ray radiation is incident in the second region 1202 about 600 times and, therefore, a signal that does not accurately indicate the energy of the soft X-ray radiation is output each time. Soft X-ray radiation is incident on the third region 1203 about 300 times and, therefore, the soft X-ray is not detected.

As described above, in 700 out of 1000 detecting operations, signals are output. However, about 85% of the output signals do not accurately indicate the energy of the soft X-ray. In addition, it is difficult to determine which one of the first region 1201 and the second region 1202 receives the incident soft X-ray radiation.

Figure 12C:
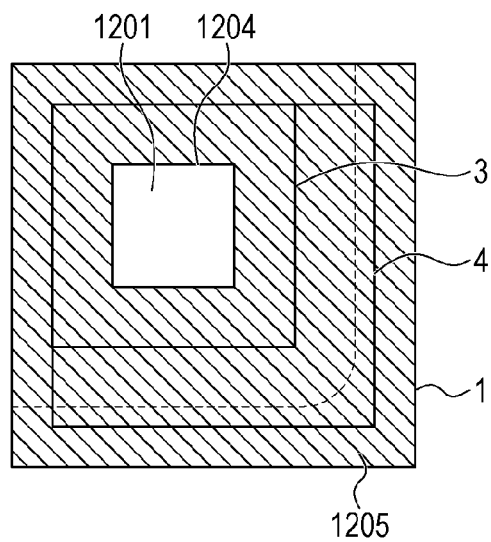
FIG. 12C is a schematic illustration of the planar structure of a detection unit of a soft X-ray detection apparatus.

In FIGS. 12B and 12C, the border between the first region 1201 and the second region 1202 is determined by a distance from a region serving as a discharge portion of electric charge. As used herein, the term "discharge portion of electric charge" refers to a region having a first conductive type transistor disposed therein.

If soft X-ray radiation is incident at a point the second distance r away from the discharge portion, the probability of the generated electron being discharged is low. For example, the second distance r can be determined so as to be equal to the radius of the smallest sphere that encloses the charge generation region. Alternatively, if the semiconductor substrate 2 is a silicon substrate, the second distance r can be 0.5 micrometer. Still alternatively, the second distance r may be a distance given by equation (2).

Note that the entirety of the circuit unit 4 may be defined as the discharge portion of electric charge. Alternatively, the semiconductor region of the circuit unit 4 to which a power supply voltage is supplied or the semiconductor region serving as the source and the drain of a MOS transistor may be defined as the discharge portion of electric charge.

As described above, as the area of the second region 1202 increases, the probability of a signal that does not accurately indicate the energy of the input soft X-ray radiation being output becomes higher. Accordingly, by minimizing the area of the second region 1202 by changing the layout of the conversion unit 3 and the first conductive type transistor serving as the discharge portion, the soft X-ray energy can be more accurately measured. A technique for decreasing the area of the second region 1202 using each of the first to third features of embodiments of the present invention is described below.

As illustrated in FIG. 1, the soft X-ray detection apparatus 100 having the first feature of embodiments of the present invention does not have the first conductive type transistor between two conversion units 3 that are immediately adjacent to each other. That is, a semiconductor region that can serve as the above-described discharge portion of electric charge is not disposed between two conversion units 3 that are immediately adjacent to each other. In this way, if soft X-ray radiation is incident at a point in the vicinity of the border between two conversion units 3 that are immediately adjacent to each other, the probability of electric charge being discharged can be reduced and, therefore, the soft X-ray radiation can be more accurately detected.

Reduction in the probability of electric charge being discharged using the first feature is described in more detail below. FIG. 1 illustrates a charge generation region 105 of the conversion unit 3e of the detection unit 1e in which electric charge is generated when soft X-ray radiation is incident in a region near the adjacent conversion unit 3f. As illustrated in FIG. 1, part of the charge generation region 105 is located inside of the conversion unit 3e, and the other part is located in the conversion unit 3f that is immediately adjacent to the conversion unit 3e. Almost all of the electrons generated in the conversion unit 3e are collected by the conversion unit 3e. The probability of electrons generated in the conversion unit 3f being collected by the conversion unit 3e is low. Instead, the probability of electrons generated in the conversion unit 3f being collected by the conversion unit 3f is high. In addition, the probability of an electron generated between the conversion unit 3e and the conversion unit 3f being collected by one of the conversion unit 3e and the conversion unit 3f through diffusion or drift is high. This is because a region serving as the electron discharge region does not appear between the conversion unit 3e and the conversion unit 3f. In this way, all or almost all of the generated electrons can be collected by one of the conversion unit 3e and the conversion unit 3f. Therefore, the soft X-ray radiation can be accurately detected on the basis of signals output from the conversion unit 3e and the conversion unit 3f.

Note that if, as described above, the charge generation region extends across a plurality of the conversion units 3, it is necessary to distinguish from the case in which one photon is incident on each of the conversion units 3. However, if nearly all of the generated electric charge can be collected, the information is not lost. Accordingly, the downstream signal processing can perform such distinction and, thus, the energy of the soft X-ray radiation can be accurately measured. For example, when the rough range of the value of the energy of the incident soft X-ray radiation is known and if a signal indicating the energy having a value that is significantly lower than the range is output, it can be determined that the charge generation region of one photon extends across a plurality of conversion units. Therefore, by performing signal processing in which the output and the output of the adjacent detection unit are summed, an energy value of the soft X-ray radiation can be accurately measured. As noted above, in order to measure the energy of the soft X-ray radiation, it is important that information is not lost, that is, only part of the generated electric charge is not discharged.

As the number of pairs of the conversion units 3 having no circuit unit 4 therebetween increases, more accurate soft X-ray detection is available. For example, the conversion unit 3e is immediately adjacent to four conversion units 3, that is, the conversion units 3b, 3d, and 3f and a conversion unit (not illustrated) disposed on the opposite side of the conversion unit 3e from the conversion unit 3b. Among the four conversion units, a circuit unit 4 is not disposed between the conversion unit 3d and the conversion unit 3e and between the conversion unit 3f and the conversion unit 3e. Furthermore, if the circuit unit 4 is not disposed between the conversion unit 3b and the conversion unit 3e, the soft X-ray can be more accurately detected. As described above, if a circuit unit 4 is not disposed between the conversion unit 3e and at least one of the other conversion units 3, the advantage of embodiments of the present invention can be provided.

In the soft X-ray detection apparatus 100 having the second feature of embodiments of the present invention, the detection unit 1a and the detection unit 1b are disposed so as to be immediately adjacent to each other. A transistor included in the detection unit 1a and a transistor included in the detection unit 1b are disposed so that the distance between the transistors is less than the first distance d. In this way, the probability of an electron generated upon incidence of soft X-ray radiation being discharged can be reduced and, therefore, the soft X-ray can be more accurately detected.

Figure 3A:
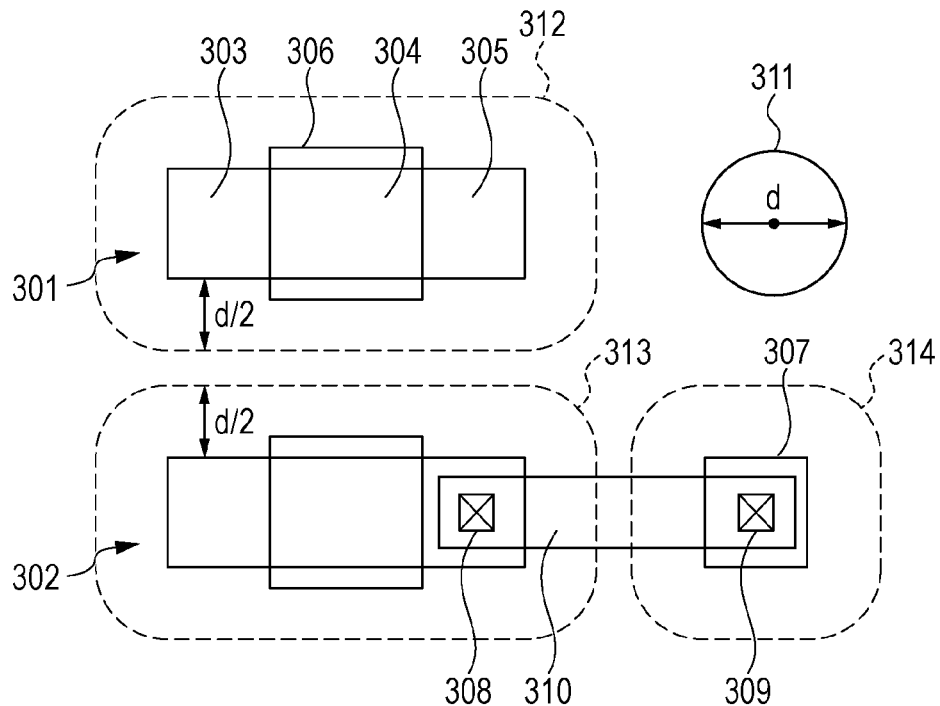
FIG. 3A is a layout diagram of two MOS transistors.
Figure 3B:
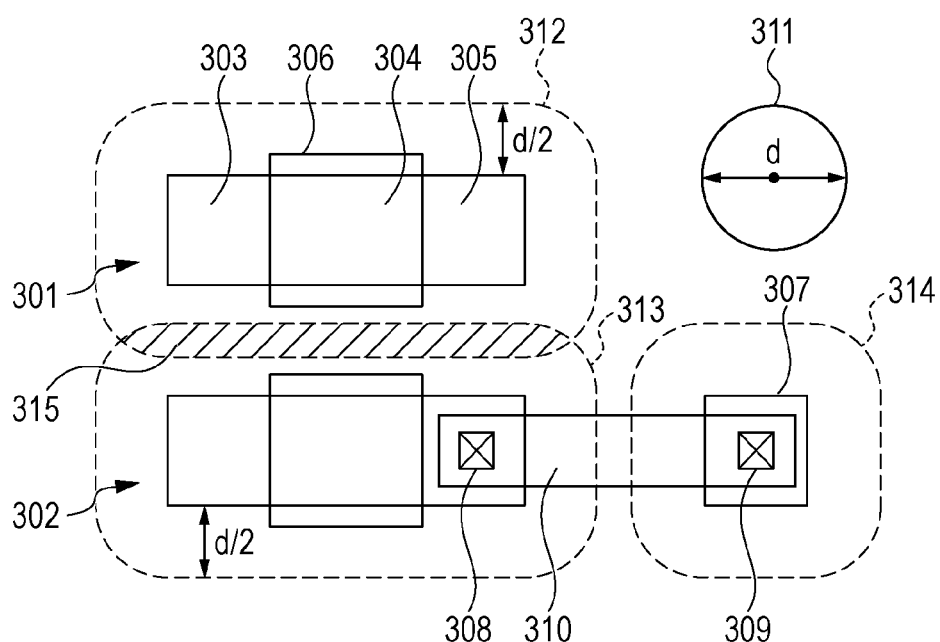
FIG. 3B is a layout diagram of two MOS transistors.

Reduction in the probability of electric charge being discharged due to the second feature is described in more detail below with reference to FIGS. 3A and 3B. FIGS. 3A and 3B illustrate two MOS transistors 301 and 302. The MOS transistor 301 is included in the first detection unit, and the MOS transistor 302 is included in a second detection unit that is immediately adjacent to the first detection unit. In FIG. 3A, the MOS transistor 301 and the MOS transistor 302 are disposed so that the distance therebetween is greater than or equal to the first distance d. In FIG. 3B, the MOS transistor 301 and the MOS transistor 302 are disposed so that the distance therebetween is less than the first distance d.

In this case, the first distance d represents the diameter of a sphere that approximates a charge generation region 311. For example, the first distance d may be given by equation (1). Alternatively, in the case of a silicon substrate, the first distance d may be 1 micrometer.

Each of the MOS transistors 301 and 302 includes a source region 303, a channel region 304, and a drain region 305. In addition, each of the MOS transistors 301 and 302 includes a gate electrode 306. The drain region of the MOS transistor 302 is connected to a power supply unit 307 via contact plugs 308 and 309 and an interconnection line 310.

The region of the transistor is formed from the source region 303, the channel region 304, the drain region 305, and the power supply unit 307. In FIGS. 3A and 3B, ranges each within d/2 from the edge of the transistor region are indicated by dotted lines 312, 313, and 314. As used herein, such a range is referred to as a "discharge region" for descriptive purposes. The second region 1202 illustrated in FIG. 12B corresponds to the discharge region. If soft X-ray radiation is incident in the discharge region, part of the charge generation region 311 overlaps the transistor region. Accordingly, some of the generated electrons are easily discharged.

In FIG. 3A, a discharge region 312 of the MOS transistor 301 does not overlap discharge regions 313 and 314 of the MOS transistor 302. Accordingly, the total area of the discharge regions is large. That is, the probability of the generated electron being discharged upon incidence of soft X-ray radiation is high.

In contrast, as illustrated in FIG. 3B, the MOS transistor 301 and the MOS transistor 302 are disposed so that the distance therebetween is less than the first distance d. Accordingly, a region 315 in which the discharge region 313 of the MOS transistor 301 partially overlaps the discharge region 314 of the MOS transistor 302 appears. In FIG. 3B, the total area of the discharge regions is less than that obtained when the distance between the two transistors is greater than or equal to the first distance d by the area of the overlap region 315. That is, the probability of the soft X-ray being incident at a point where some of the electrons are easily discharged is reduced. As a result, the soft X-ray can be more accurately detected.

In addition, if the discharge region 312 overlaps the discharge region 314, the same advantage can be provided. Alternatively, if the discharge region 313 overlaps the discharge region 314, the same advantage can be provided. As the area of the overlap region increases, the soft X-ray can be more accurately detected.

Note that the distance between the transistors may be set as a distance between the portions of the transistor regions that are the closest to each other.

In the soft X-ray detection apparatus 100 having the third feature of embodiments of the present invention, the detection units 1a and 1d are disposed so as to be immediately adjacent to each other. The first conductive type semiconductor region 11a included in the first detection unit 1a is disposed so that the distance between the first conductive type semiconductor region 11a and each of the first conductive type transistors included in the circuit unit 4 of the second detection unit 1d is greater than the second distance r.

Reduction in the probability of electric charge being discharged due to the third feature is described in more detail below. In FIGS. 12A to 12C, the second region 1202 from which part of the generated electric charge may be discharged is a region within the second distance r from a region serving as the discharge portion of the electric charge. Accordingly, by disposing the first conductive type semiconductor region 11 that forms the conversion unit 3 so that the distance between the first conductive type semiconductor region 11 and the first conductive type transistor serving as the discharge portion of the electric charge is greater than the second distance r, the overlap of the second region 1202 and the conversion unit 3 can be reduced or can be made zero. In this way, the soft X-ray can be more accurately detected.

First Exemplary Embodiment

The soft X-ray detection apparatus 100 according to a first exemplary embodiment of the present invention is described below with reference to the accompanying drawings. The soft X-ray detection apparatus 100 according to the present exemplary embodiment can detect electromagnetic waves mainly in the wavelength range from 0.1 nm to 10 nm. As described above, if an electromagnetic wave in this wavelength range is incident on the semiconductor substrate, a plurality of electrons are generated for one photon, as described above.

Note that the soft X-ray detection apparatus 100 according to the present exemplary embodiment detects electromagnetic waves mainly in the wavelength range of 0.1 nm to 10 nm at the time when soft X-ray radiation is incident on the semiconductor substrate. Accordingly, the soft X-ray detection apparatus 100 that detects only an electromagnetic wave that is wavelength-converted to a wavelength range outside the above-described range (e.g., a visible wavelength range) before the soft X-ray is incident on the semiconductor substrate is not encompassed in the scope of embodiments of the present invention. However, even when a wavelength converter used before soft X-ray radiation is incident on the semiconductor substrate is included in a soft X-ray detection apparatus, embodiments of the present invention are applicable to the soft X-ray detection apparatus if the converted wavelength is within the above-described range.

FIG. 1 is a schematic illustration of the planar structure of the soft X-ray detection apparatus 100. The soft X-ray detection apparatus 100 includes a plurality of detection units 1. In FIG. 1, six detection units 1a to 1f are illustrated. The detection units 1a to 1c are arranged along the first direction. In addition, the detection units 1d to 1f are also arranged along the first direction. In contrast, the detection unit 1a and the detection unit 1d are arranged along a second direction that is perpendicular to the first direction. The detection unit 1b and the detection unit 1e are arranged along the second direction. The detection unit 1b and the detection unit 1e are arranged along the second direction. The detection unit 1c and the detection unit 1f are arranged along the second direction. In reality, arrangement of the detection units 1a to 1f is repeated in the first direction and the second direction. For example, 2000 detection units 1 or more can be arranged along the first direction, and 1500 detection units 1 or more are arranged along the second direction. In FIG. 1, the first direction is perpendicular to the second direction. However, the first direction need not be perpendicular to the second direction. It is only required that the first direction cross the second direction.

Each of the detection units 1 includes the conversion unit 3 having the first conductive type semiconductor region therein and the circuit unit 4 having the first conductive type transistor therein. The first conductive type semiconductor region can collect a signal carrier. That is, the potential of the first conductive type semiconductor region with respect to a signal carrier is lower than that of the portion surrounding the first conductive type semiconductor region. The conversion unit 3 is formed from, for example, a photodiode. The circuit unit 4 includes a readout circuit. As illustrated in FIG. 2, the readout circuit includes the amplifier transistor 6 that amplifies a signal generated by the conversion unit 3. The conversion unit 3 is electrically separated from the circuit unit 4 by an isolation unit. In addition, the conversion units 3 of two detection units that are immediately adjacent to each other are electrically separated by an isolation unit.

According to the present exemplary embodiment, a first conductive type transistor is not disposed between the conversion units 3 arranged along the first direction. Instead, an isolation unit is disposed between the conversion units 3 arranged along the first direction. More specifically, a first conductive type transistor is not disposed between the conversion unit 3a and the conversion unit 3b and between the conversion unit 3b and the conversion unit 3c. In addition, a first conductive type transistor is not disposed between a conversion unit of a detection unit (not illustrated) that is immediately adjacent to the detection unit 1c in the first direction and the conversion unit 3c included in the detection unit 1c.

In contrast, a first conductive type transistor included in the circuit unit 4 is disposed between the conversion units 3 arranged along the second direction. More specifically, a first conductive type transistor included in the circuit unit 4 is disposed between the conversion unit 3b and the conversion unit 3e. In addition, a first conductive type transistor included in the circuit unit 4 is disposed between a conversion unit of a detection unit (not illustrated) that is immediately adjacent to the detection unit 1e in the second direction and the conversion unit 3e included in the detection unit 1e.

Figure 2:
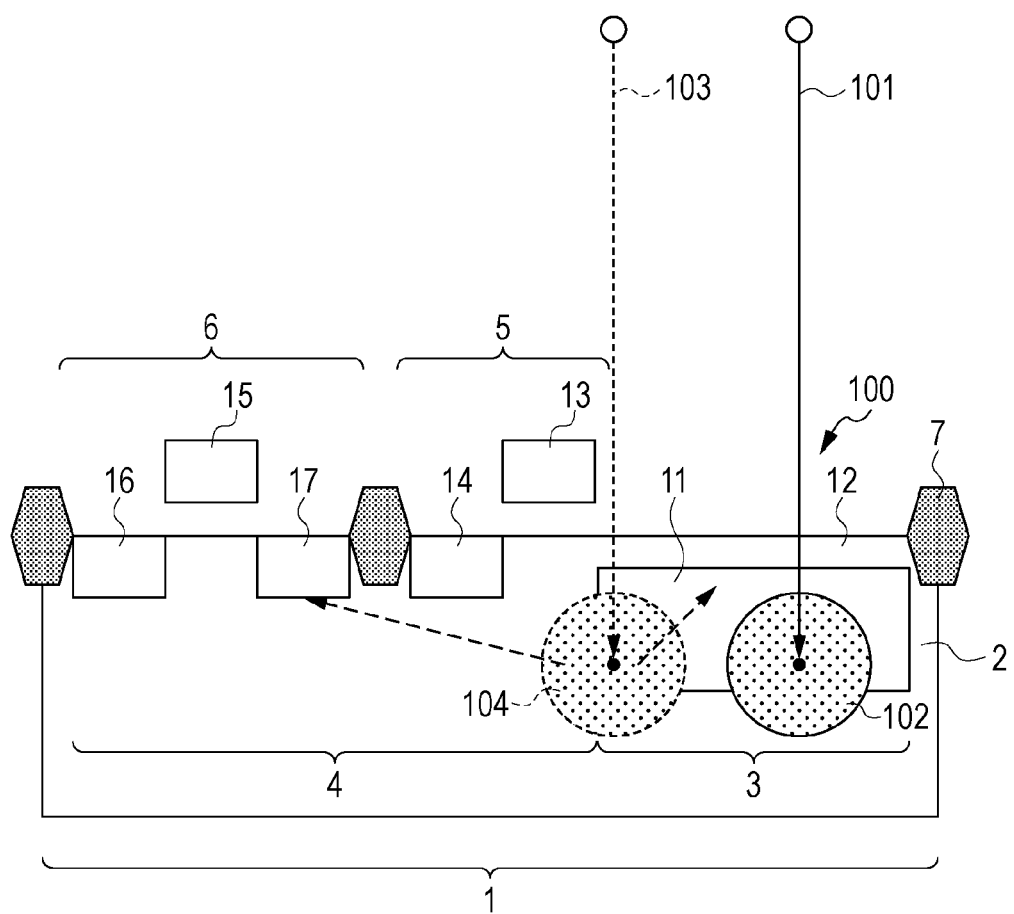
FIG. 2 is a schematic cross-sectional view of the soft X-ray detection apparatus according to the first exemplary embodiment of the present invention.

FIG. 2 is a schematic cross-sectional view of one of the detection units 1 of the soft X-ray detection apparatus 100 taken along a line II-II of FIG. 1. In FIG. 2, only the cross section of the detection unit 1c is illustrated. The cross sections of the other detection units 1 may have the same structure as that of the detection unit 1c.

According to the present exemplary embodiment, the soft X-ray detection apparatus 100 includes the semiconductor substrate 2. For example, the semiconductor substrate 2 is a P-type silicon substrate. According to the present exemplary embodiment, the detection unit 1 includes the conversion unit 3 and the circuit unit 4 disposed on the semiconductor substrate 2.

The conversion unit 3 is formed from, for example, a photodiode. According to the present exemplary embodiment, the conversion unit 3 has the N-type semiconductor region 11 serving as the first conductive type semiconductor region. A P-type semiconductor region 12 is disposed on the side of the semiconductor region 11 adjacent to the surface of the semiconductor substrate 2 (a principal surface on which the soft X-ray is incident). The N-type semiconductor region 11 forms P-N junction with each of the P-type semiconductor region 12 and the semiconductor substrate 2. That is, the P-type semiconductor region 12, the N-type semiconductor region 11, and the semiconductor substrate 2 form a buried type photodiode. Alternatively, the semiconductor substrate 2 may be formed from an N-type semiconductor substrate. A P-type semiconductor region (e.g., a P-type well) may be provided in the N-type semiconductor substrate. Thus, the P-type well, the N-type semiconductor region 11, and the P-type semiconductor region 12 can form a buried type photodiode. The potential of the N-type semiconductor region 11 with respect to an electron is lower than that of the P-type semiconductor region surrounding the N-type semiconductor region 11. Accordingly, electrons generated upon incidence of soft X-ray radiation can be collected into the N-type semiconductor region 11. Furthermore, electrons may be accumulated in the N-type semiconductor region 11. Before electrons are collected or accumulated in the N-type semiconductor region 11, a reverse bias may be applied to the N-type semiconductor region 11. The potential of the N-type semiconductor region 11 can be further reduced by the applied reverse bias. In addition, the entirety of the N-type semiconductor region 11 may be depleted by the reverse bias.

The circuit unit 4 has a transfer transistor 5 and an amplifier transistor 6 disposed therein. One or both of the transistors can have the first conductive type, that is, can be N-channel type transistor. The transfer transistor 5 is configured so as to include a transfer gate electrode 13 and a floating diffusion (FD) 14. The FD 14 is formed from an N-type semiconductor region. At least two voltages corresponding to ON and OFF of the transfer transistor 5 are applied to the transfer gate electrode 13. The potential between the N-type semiconductor region 11 of the conversion unit 3 and the FD 14 is controlled by the voltage applied to the transfer gate electrode 13. As a result, an electron generated in the conversion unit 3 can be transferred to the FD 14. At that time, all of the electrons in the conversion unit 3 may be transferred to the FD 14, or only some of the electrons may be transferred to the FD 14. If all the electric charge in the conversion unit 3 is transferred, the entirety of the N-type semiconductor region 11 is depleted. Accordingly, such a transfer operation is referred to as a "completely-depleted transfer operation".

The FD 14 is electrically connected to a gate electrode 15 of the amplifier transistor 6 via an interconnection line (not illustrated). In this way, the FD 14 forms part of an input portion of the amplifier unit. That is, the electrons generated upon incidence of the soft X-ray are transferred to the FD 14, and an amplified signal in accordance with the number of electrons is output. Accordingly, the FD 14 can be also referred to as a "detection node".

The amplifier transistor 6 is formed from a MOS transistor including the gate electrode 15, a source region 16, and a drain region 17. Each of the source region 16 and the drain region 17 is formed from an N-type semiconductor region. That is, the amplifier transistor 6 is an N-channel MOS transistor. The gate electrode 15 of the amplifier transistor 6 forms part of the input portion of the amplifier unit. The drain region 17 is electrically connected to a power supply unit (not illustrated).

According to the present exemplary embodiment, an isolation unit 7 employs insulator separation. The isolation unit 7 electrically separates the conversion unit 3 from a conversion unit of an immediately adjacent detection unit (not illustrated). In addition, the isolation unit 7 separates the conversion unit 3 from the circuit unit 4. Furthermore, the isolation unit 7 may electrically separate a plurality of the transistors from one another in the circuit unit 4. The isolation unit 7 may have the P-type semiconductor region disposed in the lower portion thereof. For example, the isolation unit 7 is formed by shallow trench isolation (STI).

In addition, although not illustrated in FIG. 2, a semiconductor region for supplying a predetermined voltage to the semiconductor substrate 2 may be disposed on the semiconductor substrate 2. Furthermore, a semiconductor region for supplying a power supply voltage may be disposed. The semiconductor region for supplying a power supply voltage may be the drain region of the amplifier transistor.

Figure 4:
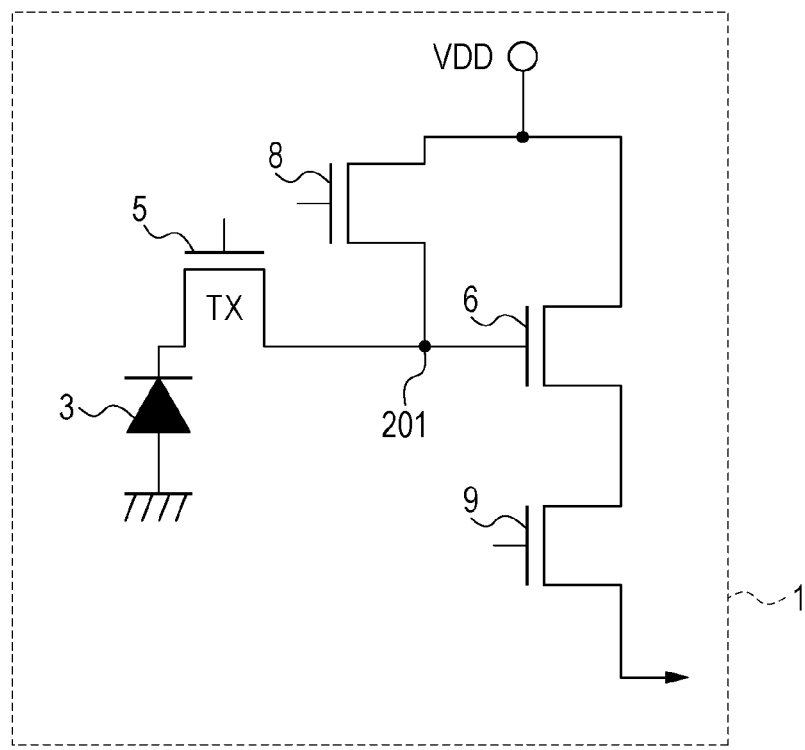
FIG. 4 is an equivalent circuit diagram of the soft X-ray detection apparatus according to the first exemplary embodiment of the present invention.

FIG. 4 is an equivalent circuit diagram of the detection unit 1 of the soft X-ray detection apparatus 100 according to the present exemplary embodiment. The same reference symbol is used to indicate elements in FIGS. 4 and 2 which perform the same or a similar function, and detailed descriptions of the elements are not repeated.

The detection unit 1 further includes a reset transistor 8 and a selection transistor 9. The anode of the photodiode serving as the conversion unit 3 is connected to a detection node 201 via the transfer transistor 5. The detection node 201 corresponds to the gate electrode 15 of the amplifier transistor 6 and the FD 14 illustrated in FIG. 2. According to the present exemplary embodiment, since the FD 14 and the gate electrode 15 of the amplifier transistor 6 are connected to each other, the both correspond to the detection node 201. That is, the detection node 201 also serves as an input node of the amplifier unit.

The drain of the reset transistor 8 receives a power supply voltage VDD. The source of the reset transistor 8 is connected to the detection node 201. The reset transistor 8 resets the voltage of the detection node 201 in accordance with the voltage supplied to the gate of the reset transistor 8. The reset transistor 8 is formed from, for example, an N-channel MOS transistor.

The drain of the selection transistor 9 is connected to the source of the amplifier transistor 6. The source of the selection transistor 9 is connected to an output line (not illustrated). If the selection transistor 9 is turned on by the voltage supplied to the gate of the selection transistor 9, a signal in accordance with the voltage of the detection node 201 is output to the output line. That is, when signals are output from a plurality of the detection units 1 to a single output line, one of the detection units 1 that outputs the signal can be selected by using the selection transistor 9.

The need for the reset transistor 8 and the selection transistor 9 can be appropriately eliminated. For example, by controlling the voltage of the detection node 201 of a detection unit that is not selected to turn off the amplifier transistor 6, the need for the selection transistor 9 can be eliminated. Alternatively, in the case of a linear sensor, the need for the selection transistor 9 can be eliminated. Still alternatively, when the conversion unit 3 is formed from a phototransistor and if the generated electric charge is read in the form of a photo-electric current, the need for the reset transistor 8 can be eliminated.

The positional relationship among the transistors in the circuit unit 4 is described next. According to the present exemplary embodiment, the circuit unit 4 of the detection unit 1 has the transfer transistor 5, the amplifier transistor 6, the reset transistor 8, and the selection transistor 9 disposed therein.

For example, in a circuit unit 4b of the detection unit 1b illustrated in FIG. 1, an amplifier transistor 6b is disposed in a region in the vicinity of the detection unit 1c. In addition, in a circuit unit 4c of the detection unit 1c, a reset transistor 8c is disposed in a region in the vicinity of the detection unit 1b. As a result, the amplifier transistor 6b and the reset transistor are disposed so that the distance therebetween is less than 1 micrometer. In this way, a plurality of the transistors of different detection units are disposed so that the distances between the transistors are less than the first distance d. Herein, the first distance d is equal to the diameter of the smallest sphere that encloses the charge generation region or a distance given by equation (1).

Note that the border between the conversion unit 3 and the circuit unit 4 of the detection unit 1 is determined on the basis of the planar structure of the detection units 1. A region including the transfer transistor 5 (i.e., the transfer gate electrode 13 and the FD 14), the amplifier transistor 6, the reset transistor 8, and the selection transistor 9 functions as the circuit unit 4 of the detection unit 1. The border of the conversion unit 3 is determined by the border of, for example, the N-type semiconductor region 11. However, if the N-type semiconductor region 11 extends under another element, the border of the conversion unit 3 is determined by the edge of that element. In addition, the region having the element disposed therein is included in the circuit unit 4. For example, if the N-type semiconductor region 11 extends under the transfer gate electrode 13, the edge of the transfer gate electrode 13 is defined as the border of the conversion unit 3. In addition, the region having the transfer gate electrode 13 disposed therein is included in the circuit unit 4.

As described above, in the soft X-ray detection apparatus 100 according to the present exemplary embodiment, a first conductive type transistor is not disposed between two conversion units 3 that are immediately adjacent to each other. Instead, the isolation unit 7 is disposed. According to such a structure, the area of the discharge region (a region corresponding to the second region 1202 illustrated in FIGS. 12A to 12C) of the conversion unit 3 can be reduced. Accordingly, the probability of the electric charge being discharged can be reduced and, therefore, the soft X-ray can be accurately detected.

In addition, in the soft X-ray detection apparatus 100 according to the present exemplary embodiment, for the detection unit 1a and the detection unit 1b that are immediately adjacent to each other, the distance between a transistor included in the detection unit 1a and a transistor included in the detection unit 1b is less than the first distance d. According to such a structure, the discharge region (a region corresponding to each of the regions 312 to 314 illustrated in FIGS. 3A and 3B or the second region 1202 illustrated in FIG. 12) can be reduced. Accordingly, the probability of the electric charge being discharged can be reduced and, therefore, the soft X-ray can be more accurately detected.

Modification of First Exemplary Embodiment

A modification of each of the elements of the first exemplary embodiment is described next. The following modifications can be combined as needed. In addition, the modifications are applicable to second to ninth exemplary embodiments described below.

While the first exemplary embodiment has been described with reference to the structure in which an electron serves as a signal carrier, a structure in which a hole serves as a signal carrier may be employed. In the structure in which a hole serves as a signal carrier, the conductive type of a semiconductor region is opposite to that used in the present exemplary embodiment. For example, the buried type photodiode has a structure in which the N-type semiconductor region, the P-type semiconductor region, and the N-type semiconductor region are disposed in this order from the surface side. In addition, electric charge generated upon incidence of soft X-ray radiation is collected into the P-type semiconductor region. Furthermore, the FD 14 is configured so as to include a P-type semiconductor region.

In such a case, it is important that among the semiconductor regions that form transistors, a P-type semiconductor region be not disposed between two P-type semiconductor regions that are immediately adjacent to each other and that have the same conductive type as the P-type semiconductor region. This is because if a signal carrier is a hole, the P-type semiconductor region may function as the discharge portion.

In addition to a silicon substrate, the semiconductor substrate 2 may be formed from a semiconductor substrate of a variety of another type, such as a germanium substrate or a gallium arsenide substrate. The semiconductor substrate 2 may be either one of a P-type substrate and an N-type substrate. The semiconductor substrate 2 may be formed by epitaxial growth. Alternatively, the semiconductor substrate 2 may be a silicon on insulator (SOI) substrate. Still alternatively, a P-type well or an N-type well may be disposed in the semiconductor substrate 2 as needed. If a well is disposed in the semiconductor substrate 2, the semiconductor regions forming the conversion unit 3 and the amplifier transistor 6 are disposed inside the well.

In the first exemplary embodiment, at least two voltages corresponding to ON and OFF of the transfer transistor 5 are applied to the transfer gate electrode 13 of the transfer transistor 5. In addition, a medium voltage between the voltages corresponding to ON and OFF may be applied to the transfer gate electrode 13. Alternatively, only a constant voltage may be applied to the transfer gate electrode 13 so that a potential between the N-type semiconductor region 11 and the FD 14 is controlled to be constant. Note that the transfer transistor 5 is not essential. The need for the transfer transistor 5 may be eliminated as necessary. If the transfer transistor 5 is removed, the N-type semiconductor region 11 of the conversion unit 3 needs to be connected to the gate electrode of the amplifier transistor 6, for example. In such a case, the FD 14 may be also removed.

Electrical connection between the FD 14 and the gate electrode 15 of the amplifier transistor 6 is achieved by using, for example, a metal wire, a contact plug that connects the metal wire to the FD 14, and a contact plug that connects the metal wire to the gate electrode 15. Alternatively, the gate electrode 15 may be in direct contact with the FD 14. Still alternatively, the FD 14 may be connected to the gate electrode 15 using a common contact plug that is connected to the FD 14 and the gate electrode 15. The contact plug is formed from, for example, tungsten.

In addition, a switch may be disposed in an electrical path between the FD 14 and the gate electrode 15 of the amplifier transistor 6. In such a structure, the FD 14 can temporarily hold electrons. That is, the FD 14 may function as the charge holding unit disposed for each of the detection units.

While the first exemplary embodiment has been described with reference to the amplifier transistor 6 formed from a MOS transistor, the amplifier transistor 6 may be formed from a variety of active elements, such as a bipolar transistor, a junction field effect transistor (JFET), or a static induction transistor (SIT). In addition, while the first exemplary embodiment has been described with reference to the amplifier transistor 6 that forms a source follower circuit, the amplifier unit may have another structure. For example, a voltage follower using an inverting amplifier circuit and an operating amplifier including a MOS transistor may be employed.

In FIG. 2, the selection transistor 9 is disposed in an electrical path between the source of the amplifier transistor 6 and the output line (not illustrated). However, the selection transistor 9 may be disposed between the drain of the amplifier transistor 6 and the power supply. Alternatively, the need for the selection transistor 9 may be eliminated.

The FD 14, the amplifier transistor 6, the reset transistor 8, and the selection transistor 9 may be shared by the plurality of detection units 1. For example, the transfer gate electrode 13 may be disposed for the conversion unit 3 of each of the detection units 1, and the electron of each of the conversion units 3 may be independently transferred to the shared FD 14. In such a case, the amplifier transistor 6, the reset transistor 8, and the selection transistor 9 can be disposed for each of the detection units 1. Since a plurality of detection units 1 share these elements, the ratio of the area of the circuit unit 4 to the area of the conversion unit 3 can be reduced. Thus, the soft X-ray can be more accurately detected.

An absorbing unit that absorbs soft X-ray radiation may be disposed on a principal surface of the semiconductor substrate 2 opposite to a principal surface of the semiconductor substrate 2 on which soft X-ray radiation is incident. Since the absorbing unit absorbs soft X-ray radiation that has passed through the semiconductor substrate 2, the probability of the soft X-ray that has passed through the semiconductor substrate 2 having a negative impact on the other portion of the soft X-ray detection apparatus can be reduced.

The example in which the isolation unit 7 is formed by STI has been described with reference to FIG. 2. However, the isolation unit 7 may be formed through a local oxidation of silicon (LOCOS) isolation process. In addition, a semiconductor region having a conductive type that is opposite to the conductive type of a region into which the electric charge of the conversion unit is accumulated may be disposed under the oxide film used in STI or LOCOS isolation. Alternatively, the isolation unit 7 may be formed through P-N-junction isolation without using an oxide film. Still alternatively, these element isolation structures may be employed at the same time.

When PN-junction isolation is employed or the semiconductor region having an opposite conductive type is disposed under the oxide film, the P-type semiconductor region is disposed so as to be in contact with the N-type semiconductor region 11. In such a structure, a depletion layer extends to the N-type semiconductor region and the P-type semiconductor region. A portion of the P-type semiconductor region in which the depletion layer is generated can be considered as part of the conversion unit 3. That is, if electric charge generated in some portion is collected into a predetermined region, such a portion can be part of the conversion unit 3.

A filter that blocks an electromagnetic wave having a predetermined wavelength may be disposed on the conversion unit 3. In this way, soft X-ray radiation in a wavelength range to be mainly detected by the conversion unit 3 is incident on the conversion unit 3. Accordingly, the soft X-ray can be more accurately detected.

While the first exemplary embodiment has been described with reference to the structure in which soft X-ray radiation is incident on the conversion unit through a principal surface having the gate electrode of a transistor disposed thereon, a structure in which soft X-ray radiation is incident on the conversion unit through a principal surface opposite to a principal surface having the gate electrode of a transistor disposed thereon may be employed. That is, a structure known as a back illuminated structure may be employed.

Second Exemplary Embodiment

Figure 5:
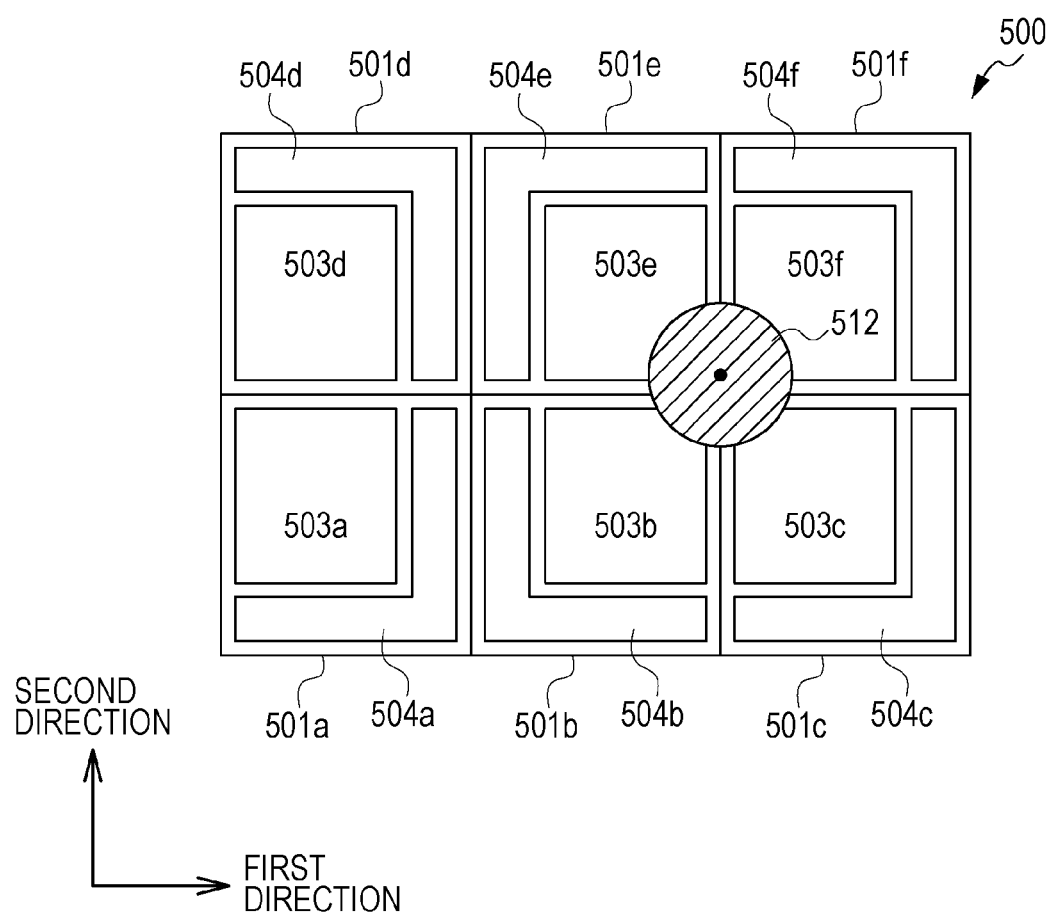
FIG. 5 is a schematic illustration of the planar structure of a soft X-ray detection apparatus according to a second exemplary embodiment of the present invention.

A soft X-ray detection apparatus 500 according to a second exemplary embodiment of the present invention is described below with reference to the accompanying drawings. FIG. 5 is a schematic illustration of the planar structure of the soft X-ray detection apparatus 500. The second exemplary embodiment differs from the first exemplary embodiment in terms of the layout of a conversion unit 503 and a circuit unit 504 in a detection unit 501. The other structures are the same as those of the first exemplary embodiment or the modification of the first exemplary embodiment and, therefore, descriptions of the structures are not repeated.

According to the present exemplary embodiment, a detection unit 501b and a detection unit 501c are arranged along the first direction. Similarly, a detection unit 501e and a detection unit 501f are arranged along the first direction. The detection unit 501b and the detection unit 501c are disposed so as to be immediately adjacent to each other. In addition, the detection unit 501e and the detection unit 501f are disposed so as to be immediately adjacent to each other.

Furthermore, a detection unit 501b and a detection unit 501e are arranged along the second direction. Similarly, a detection unit 501c and a detection unit 501f are arranged along the second direction. The detection unit 501b and the detection unit 501e are disposed so as to be immediately adjacent to each other. In addition, the detection unit 501c and the detection unit 501f are disposed so as to be immediately adjacent to each other.

The first direction intersects the second direction. According to the present exemplary embodiment, the first direction is perpendicular to the second direction. However, the first direction need not be perpendicular to the second direction.

In this way, according to the present exemplary embodiment, the detection units 501b, 501c, 501e, and 501f form a matrix of two rows and two columns. In addition, a first conductive type transistor is not disposed between every adjacent two of the conversion units 503b, 503c, 503e, and 503f of the detection units 501b, 501c, 501e, and 501f, respectively. Instead, an isolation unit is disposed. In addition, circuit units 504b, 504c, 504e, and 504f are disposed so as to surround the conversion units 503b, 503c, 503e, and 503f arranged in two rows and two columns.

A block of detection units arranged in two rows and two columns, such as the detection units 501b, 501c, 501e, and 501f, is repeatedly arranged a plurality of times. For example, a detection unit 501a and a detection unit 501d are included in a block immediately adjacent to the block.

As described above, in the soft X-ray detection apparatus 500 according to the present exemplary embodiment, a first conductive type transistor is not disposed between every adjacent two of conversion units arranged in two rows and two columns. Instead, an isolation unit is disposed. According to such a structure, even when a charge generation region 512 extends across the four conversion units 503b, 503c, 503e, and 503f, an electron can be read out of each of the conversion units. In this way, almost all electrons can be read and, therefore, the soft X-ray can be accurately detected.

In addition, any layout of the transistors in the circuit unit 504 can be employed. For example, the transistors may be disposed so that the distance between each of the transistors included in the circuit unit 504b and any one of the transistors included in the adjacent detection unit is less than the first distance d. Since the block of the detection units having circuit units in a peripheral portion of the block is repeatedly arranged, the above-described layout of the transistors is available.

According to such a structure, the number of transistors each disposed the first distance d or less away from another transistor can be increased. Accordingly, the area of the above-described overlap of the discharge regions is increased. As a result, the total area of the discharge regions can be reduced. That is, the percentage of the area of the region corresponding to the first region 1201 illustrated in FIG. 12B can be increased, while the percentage of the area of a region corresponding to the second region 1202 can be decreased. Thus, the probability of electric charge being discharged can be reduced and, therefore, the soft X-ray can be more accurately detected.

Third Exemplary Embodiment

Figure 6:
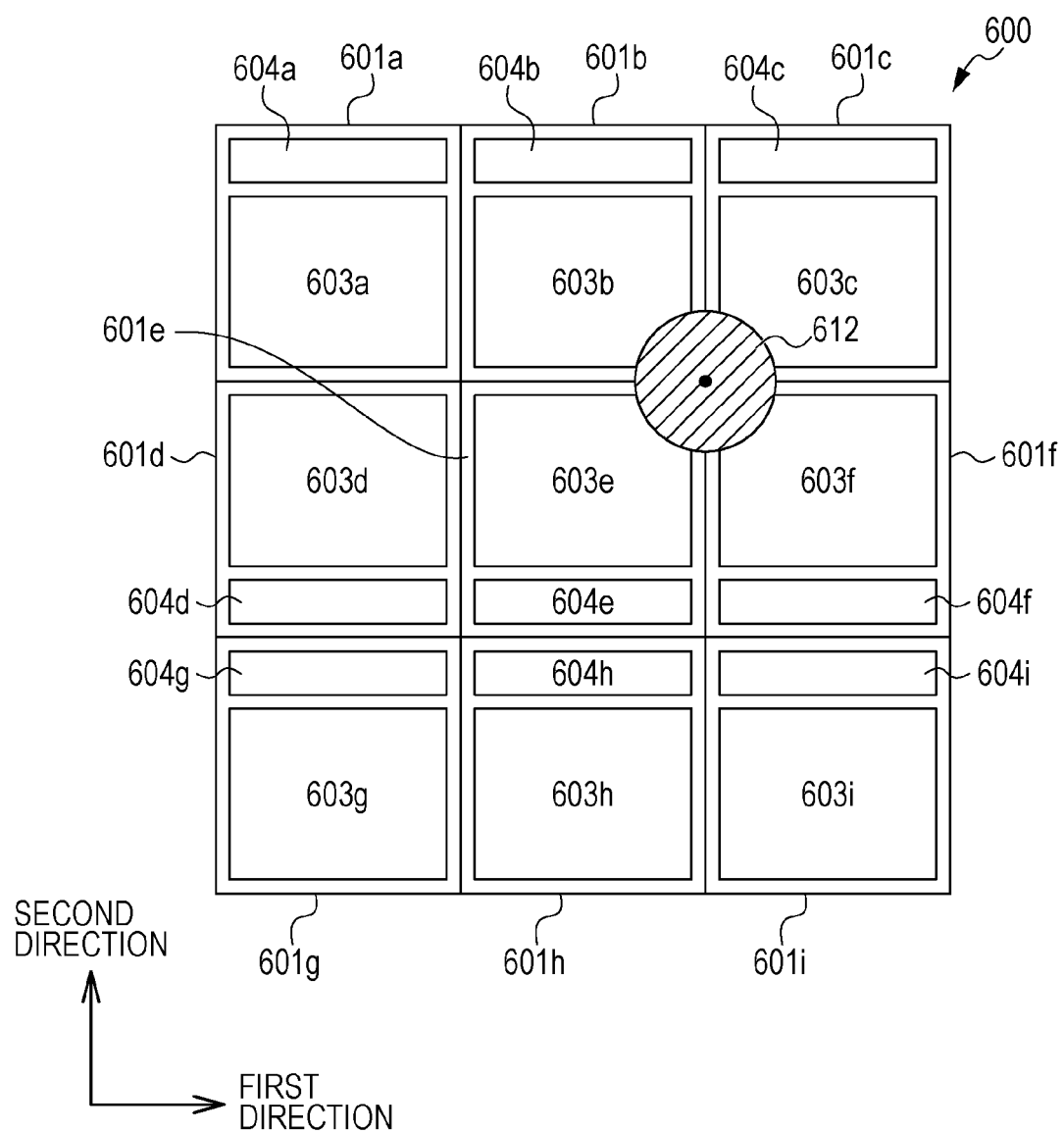
FIG. 6 is a schematic illustration of the planar structure of a soft X-ray detection apparatus according to a third exemplary embodiment of the present invention.

A soft X-ray detection apparatus 600 according to a third exemplary embodiment of the present invention is described below with reference to the accompanying drawings. FIG. 6 is a schematic illustration of the planar structure of the soft X-ray detection apparatus 600. The third exemplary embodiment differs from the first exemplary embodiment in terms of the layout of a conversion unit 603 and a circuit unit 604 in a detection unit 601. The other structures are the same as those of the first exemplary embodiment or the modification of the first exemplary embodiment and, therefore, descriptions of the structures are not repeated.

According to the present exemplary embodiment, detection units 601a to 601c are arranged along the first direction. Similarly, detection units 601d to 601f are arranged along the first direction, and detection units 601g to 301i are arranged along the first direction. In a plurality of the detection units 601 arranged along the first direction, a transistor is not disposed between two adjacent conversion units 603. Instead, an isolation unit is disposed.

A conversion unit 603e of the detection unit 601e is disposed between a conversion unit 603b of the detection unit 601b and a conversion unit 603h of a detection unit 601h in the second direction that intersects the first direction. A circuit unit 604e and a circuit unit 604h are disposed between the conversion unit 603e and the conversion unit 603h. In contrast, a transistor is not disposed between the conversion unit 603e and the conversion unit 603b. Instead, an isolation unit is disposed. This structure differs from the structure of the first exemplary embodiment.

The structures between the conversion unit 603a and a conversion unit 603d and between the conversion unit 603d and a conversion unit 603g are the same as those between the conversion unit 603b and the conversion unit 603e and between the conversion unit 603e and the conversion unit 603h. In addition, the structures between a conversion unit 603c and a conversion unit 603f and between the conversion unit 603f and a conversion unit 603i are the same as those between the conversion unit 603b and the conversion unit 603e and between the conversion unit 603e and the conversion unit 603h.

That is, according to the present exemplary embodiment, in the detection units 601a to 601i disposed in a matrix, a positional relationship between the conversion unit 603 and the circuit unit 604 is alternately reversed on a row-by-row basis (or a column-by-column basis). Accordingly, if one of the detection units has an adjacent detection unit on either side along the second direction, the conversion unit 603 of the detection unit is located so as to be close to the conversion unit 603 of one of the adjacent detection unit. At that time, the circuit unit 604 of the detection unit is located so as to be in close proximity to the circuit unit 604 of the other adjacent detection unit. For example, the conversion units 603b and 603e are located so as to be close to each other, and the circuit units 604e and 604h are located so as to be in close proximity to each other.

According to such a structure, even when a charge generation region 612 extends across four conversion units 603b, 603c, 603e, and 603f, an electron can be read out of each of the conversion units 603b, 603c, 603e, and 603f. Accordingly, almost all electrons can be read and, therefore, the soft X-ray can be accurately detected.

Furthermore, according to the present exemplary embodiment, the circuit units 604 are disposed so as to be close to each other. Accordingly, each of the transistors disposed in the circuit unit 604 can be located so that the distance between the transistor and the transistor of an adjacent detection unit is less than the first distance d. According to such a structure, the area of the above-described discharge region can be reduced. Thus, the probability of electric charge being discharged can be reduced and, therefore, the soft X-ray can be accurately detected.

Fourth Exemplary Embodiment

Figure 7:
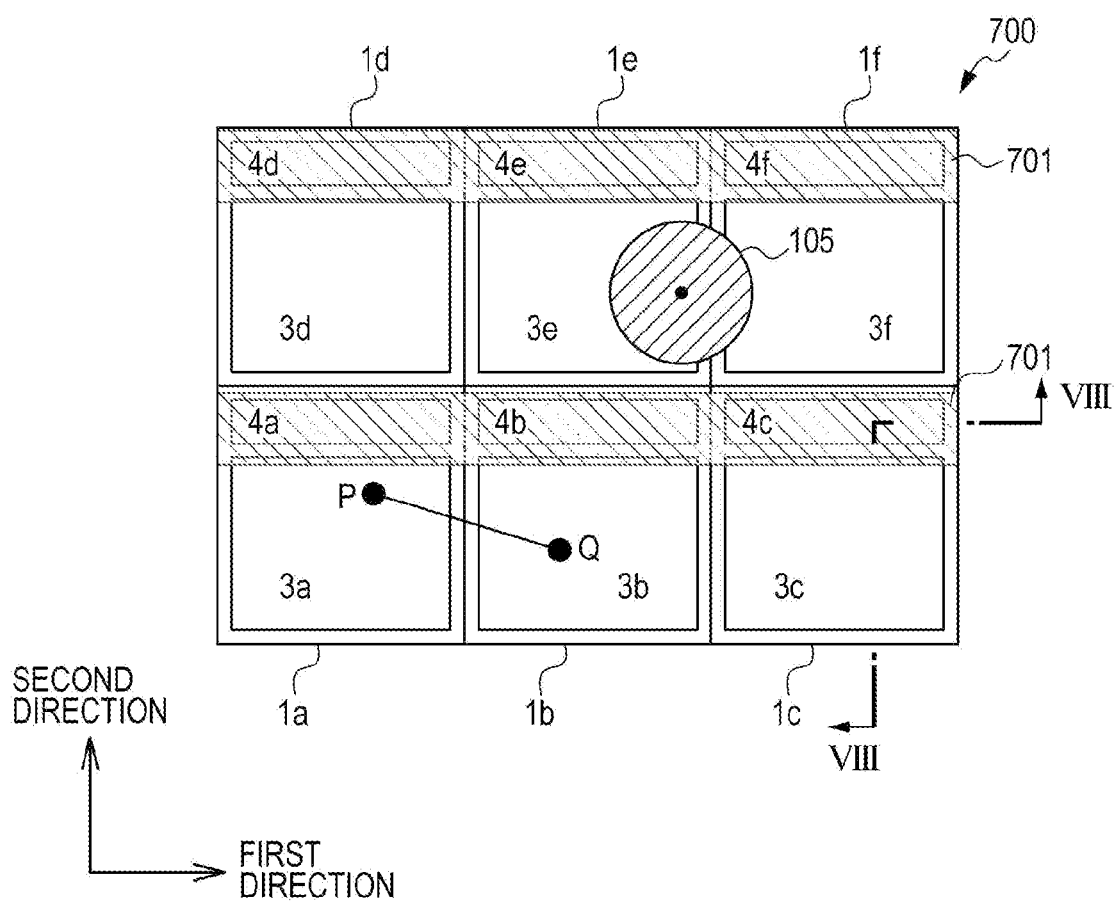
FIG. 7 is a schematic illustration of the planar structure of a soft X-ray detection apparatus according to a fourth exemplary embodiment of the present invention.

A soft X-ray detection apparatus 700 according to a fourth exemplary embodiment of the present invention is described below with reference to the accompanying drawings. FIG. 7 is a schematic illustration of the planar structure of the soft X-ray detection apparatus 700. The same reference symbol is used to indicate elements in FIGS. 7 and 1 which perform the same or a similar function, and detailed descriptions of the elements are not repeated. The present exemplary embodiment differs from the first to third exemplary embodiments in that a shielding unit 701 that blocks soft X-ray radiation is provided so as to overlap the circuit unit 4. The other elements are the same as those of any one of the first to third exemplary embodiments or the modification of the first exemplary embodiment and, therefore, descriptions of the elements are not repeated.

As illustrated in FIG. 7, the shielding unit 701 is provided above the circuit unit 4. If the shielding unit 701 is projected onto a principal surface of the semiconductor substrate 2 in a direction perpendicular to the principal surface, part or the entirety of the shielding unit 701 is projected on part or the entirety of the circuit unit 4. That is, the shielding unit 701 is disposed so as to overlap part or the entirety of the circuit unit 4. In other words, the shielding unit 701 covers part or the entirety of the circuit unit 4. Hereinafter, the term "disposing two members so that the two members overlap each other" refers to when one of the members is projected onto a principal surface of the semiconductor substrate 2 in a direction perpendicular to the principal surface, projecting at least part of one member on at least part of the region of the other member, unless expressly specified otherwise. At that time, the two members may be in contact with each other. Alternatively, another member may be disposed between the two members. As used herein, a principal surface of the semiconductor substrate 2 is an interface surface between, for example, a layer formed from a semiconductor material and another material (e.g., an insulating material).

Figure 8:
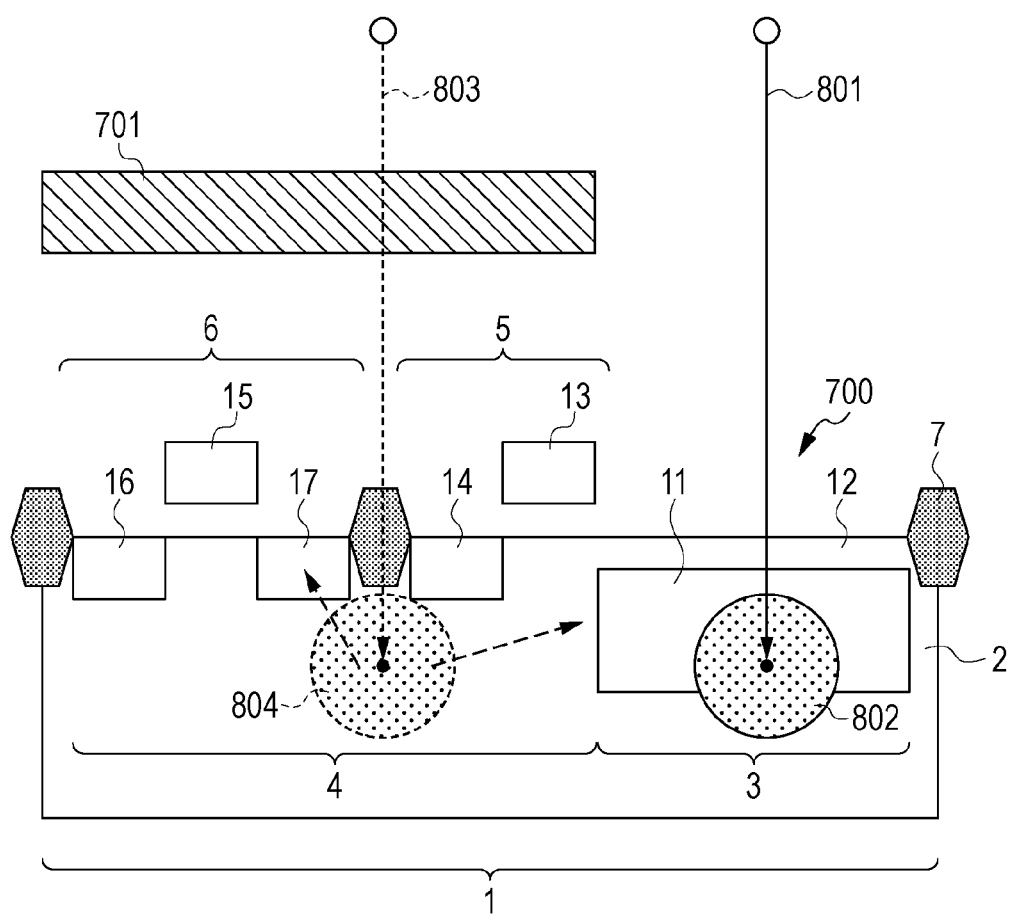
FIG. 8 is a schematic cross-sectional view of the soft X-ray detection apparatus according to the fourth exemplary embodiment of the present invention.

FIG. 8 is a schematic cross-sectional view of FIG. 7 taken along a line VIII-VIII. The same reference symbol is used to indicate elements in FIGS. 8 and 2 which perform the same or a similar function, and detailed descriptions of the elements are not repeated.

The shielding unit 701 includes a portion of a layer located above the gate electrode 15 of the amplifier transistor 6. If a detection unit includes a transistor, the layout of conductor members in a wiring layer including the gate electrode of the transistor may be restricted. Accordingly, in general, it is difficult to increase the shielding performance only by using the wiring layer including the gate electrode.

Therefore, according to the present exemplary embodiment, the shielding unit 701 that shields the circuit unit 4 is provided in a layer above the wiring layer including the gate electrode. In this way, the soft X-ray shielding performance can be improved. Note that the term "layer above the wiring layer including the gate electrode" refers to a layer that is farther from the semiconductor substrate than the wiring layer including the gate electrode.

The shielding unit 701 blocks part or all of the soft X-ray radiation that can be incident on the circuit unit 4. The shielding unit 701 need not block all of the soft X-ray radiation that can be incident on the circuit unit 4. It is only required that the shielding unit 701 block at least part of the soft X-ray radiation that can be incident on the circuit unit 4. For example, the shielding unit 701 may allow a predetermined percentage of the soft X-ray radiation to pass therethrough. In addition, the entirety of the circuit unit 4 need not be covered by the shielding unit 701.

Part of the soft X-ray radiation that does not pass through the shielding unit 701 need not be absorbed by the shielding unit 701. For example, the part of the soft X-ray radiation can be prevented from entering the circuit unit 4 by scattering, diffraction, or reflection. In addition, the part of the soft X-ray may be incident on the conversion unit 3 due to scattering, diffraction, or reflection.

It is desirable that the soft X-ray shielding coefficient of the material that forms the shielding unit 701 be higher than those of aluminum and copper. In addition, it is desirable that the material that forms the shielding unit 701 include an element having an atomic number greater than or equal to 70. This is because in general, an element having a higher atomic number has a higher soft X-ray shielding performance.

The shielding coefficient can be measured using, for example, the following technique. That is, a film having a predetermined thickness is formed using a material to be measured first. Subsequently, soft X-ray radiation having a predetermined amount (a predetermined strength) is emitted to the film, and the amount (the strength) of the soft X-ray that has passed through the film is measured. In this way, an amount of the soft X-ray blocked by the film is measured. Thereafter, the ratio of the amount of the blocked soft X-ray to the amount of the emitted soft X-ray is defined as the shielding coefficient. That is, a material that allows a higher amount of the soft X-ray to pass therethrough has a lower shielding coefficient. Conversely, a material that allows a lower amount of the soft X-ray to pass therethrough has a higher shielding coefficient. In order to compare the shielding coefficients of different materials with each other, films having the same thickness are formed. Thereafter, the amounts of the soft X-ray that pass through the films are compared. Alternatively, the amounts of blocked soft X-ray may be normalized with respect to the thickness of the film, and the normalized values may be compared. Note that soft X-ray radiation that is blocked by a film indicates the soft X-ray that does not pass through the film. For example, the soft X-ray does not pass through the film because the film absorbs, reflects, diffracts, or scatters the soft X-ray.

The structure of the shielding unit 701 according to the present exemplary embodiment is described in more detail next. The shielding unit 701 is disposed so as to overlap the transfer transistor 5 and the amplifier transistor 6. The shielding unit 701 is disposed in a layer above the gate electrode 15 of the amplifier transistor 6. The shielding unit 701 blocks soft X-ray radiation emitted to the circuit unit 4. The material that forms the shielding unit 701 is tantalum. It is desirable that the film thickness of the shielding unit 701 range from 0.5 micrometer to 1.0 micrometer. If the film thickness of the shielding unit 701 is less than 0.5 micrometer, a sufficient shielding performance may not be obtained. In contrast, if the film thickness of the shielding unit 701 is greater than 1.0 micrometer, a high stress is generated and, therefore, it is difficult to form the shielding unit 701. However, the film thickness of the shielding unit 701 may be outside the range from 0.5 micrometer to 1.0 micrometer, as needed. Note that the shielding unit 701 need not block all the emitted soft X-ray. It is only required that the amount of the soft X-ray incident on the circuit unit be reduced.

The shielding performance of a material that forms the shielding unit 701 is described next. As an example, the soft X-ray transmittances of tantalum and the aluminum are compared. The ratio of the transmittance per unit thickness of tantalum to the transmittance per unit thickness of aluminum for soft X-ray radiation having an energy lower than or equal to 10 keV is less than 100 percent. That is, for soft X-ray radiation having an energy lower than or equal to 10 keV, the transmittance of tantalum is lower than the transmittance of aluminum. Thus, the shielding coefficient of tantalum is higher than the shielding coefficient of aluminum. In addition, the shielding coefficient of tantalum is higher than the shielding coefficient of copper. By forming the shielding unit 701 using a material having a soft X-ray shielding coefficient that is higher than those of aluminum and copper, the soft X-ray can be sufficiently blocked for the circuit unit 4.

In particular, the shielding coefficient of tantalum with respect to soft X-ray radiation having an energy lower than or equal to 5 keV is twice the shielding coefficient of aluminum or higher. For example, to obtain the shielding performance that is the same as the shielding performance of the shielding unit 701 made of aluminum with respect to soft X-ray radiation having an energy lower than or equal to 5 keV, the shielding unit 701 made of tantalum needs only a half the thickness of the shielding unit 701 made of aluminum. If the thickness of the shielding unit 701 is large, a high stress is generated. Thus, the reliability of the apparatus may be decreased. Therefore, if the shielding unit 701 is formed using a material having a shielding coefficient higher than that of aluminum, the balance between the shielding performance and the reliability can be advantageously easily optimized.

The material that forms the shielding unit 701 is not limited to tantalum. It is desirable that the shielding unit 701 be formed using a material having a soft X-ray shielding coefficient higher than those of aluminum and copper. Alternatively, it is desirable that the shielding unit 701 be formed of a material containing an element having an atomic number greater than or equal to 70. In order to easily perform a semiconductor process, tantalum, tungsten, or gold can be used, for example. Alternatively, the shielding unit 701 may be formed of a metal alloy composed primarily of tantalum, tungsten, or gold (i.e., a primary component). If easily performing a semiconductor process is the first priority, the shielding unit 701 may be formed of aluminum or copper. As used herein, the term "primary component" refers to a component that is a constituent of a chemical compound or a mixture having the highest composition ratio.

In addition, the shielding unit 701 need not be formed as a single layer. The shielding unit 701 may be formed as a multilayer including an insulating film, such as a silicon oxide film, as a middle layer. In the case of a multilayer, even when the thickness of each layer is reduced in order to reduce the stress, a high shielding performance can be obtained. In the case of a multilayer, the following structure may be employed: a structure in which the shielding unit 701 serving as a first layer is disposed on part of the circuit unit 4, the shielding unit 701 serving as a second layer different from the first layer is not disposed, but the shielding unit 701 serving as the second layer is disposed on another part of the circuit unit 4. By shielding different regions of the circuit unit 4 using different layers in this manner, the layout can be flexibly changed. In addition, if the shielding unit 701 is formed of a conductive material, the shielding unit 701 may also serve as an interconnection line. For example, the shielding unit 701 may connect the transistors to one another or supply power to the semiconductor substrate 2 and the circuit unit 4.

As illustrated in FIG. 7, the shielding unit 701 is disposed so as to overlap the entirety of the region of the circuit unit 4. However, the shielding unit 701 can be disposed over only part of the region of the circuit unit 4. That is, the shielding unit 701 need not be disposed over some part of the region of the circuit unit 4. For example, the shielding unit 701 need not be disposed over the transfer gate electrode 13 and the FD 14. Alternatively, the shielding unit 701 need not be disposed over the isolation unit 7 that is immediately adjacent to the conversion unit 3. Still alternatively, the shielding unit 701 may be disposed so as to cover only the amplifier transistor 6. Yet still alternatively, the shielding unit 701 may be disposed so as to cover only the reset transistor 8.

As the shielding unit 701 is disposed so as to overlap a more region of the circuit unit 4, the energy of the soft X-ray can be more accurately detected. If the shielding unit 701 is disposed so as to overlap the entirety of the circuit unit 4, the energy of the soft X-ray can be more accurately detected.

Alternatively, the shielding unit 701 may be disposed over only the region of the circuit unit 4 that is close to the conversion unit 3. If the shielding unit 701 may be disposed over, in particular, the region of the circuit unit 4 that is close to the conversion unit 3, the energy of the soft X-ray can be sufficiently accurately detected. This is because if the soft X-ray is incident in the region that is close to the conversion unit 3, it is highly likely that some of the generated electrons are collected by the conversion unit 3 and the other electrons are discharged.

The shielding unit 701 need not be disposed over a region of the circuit unit 4 that is far from the conversion unit 3. This is because if the soft X-ray is incident in the region of the circuit unit 4 that is far from the conversion unit 3, it is highly likely that all of the generated electrons are discharged. More specifically, the shielding unit 701 need not be disposed in a region that is 1 micrometer or more distant from the edge of the conversion unit 3. This is because even when an electron is generated in a region that is 1 micrometer or more distant from the edge of the conversion unit 3, the electron is negligibly collected by the conversion unit 3. For example, by not disposing the shielding unit 701 over a region of the circuit unit 4 a predetermined distance or more away from the conversion unit 3, the layout of the wiring and contact plugs can be made more flexible.

Among the elements disposed in the circuit unit 4, some can be selected as elements that should be shielded, and the others can be selected as elements that need not be shielded. For example, if the shielding unit 701 is disposed in a region in which the electric charge is discharged or a region close to that region, the soft X-ray can be more accurately detected. Examples of such a region include the power supply unit and a semiconductor region electrically connected to the power supply unit. In contrast, the shielding unit 701 need not be disposed in a region in which the electric charge is accumulated. For example, the shielding unit 701 need not be disposed over an FD and a capacitative element.

Existing CCD soft X-ray image pickup apparatuses do not include a circuit unit inside a detection unit. Accordingly, a shielding structure of the circuit unit including an amplifier unit is not studied. As described above, by appropriately designing a shielding structure for the detection unit including the amplifier unit, the soft X-ray can be more accurately detected.

Although not illustrated in FIG. 7, a plurality of wiring layers may be provided in addition to the shielding unit 701. Each of the wiring layers includes a conductive member for connecting the transistors and the FD 14 to one another and a conductive member for supplying a power supply voltage and the ground voltage. The conductive members are formed from, for example, aluminum or copper. In particular, a material having an electric conductivity higher than that of a material that forms the shielding unit 701 may be used for the conductive members. Each of aluminum and copper has an electric conductivity higher than that of tantalum. An interlayer insulating film is disposed between two of the wiring layers. The conductive members in different wiring layers are electrically insulated by the interlayer insulating film. A conductive material that serves as a barrier metal can be disposed between the conductive member and the interlayer insulating film as needed. Titanium, a titanium alloy, tantalum, or a tantalum alloy is used as the barrier metal. If the same material (e.g., tantalum) is used for the shielding unit 701 and the barrier metal, it is desirable that the thickness of the shielding unit 701 be greater than the thickness of the barrier metal.

The shielding unit 701 can be used as an interconnection line. That is, the shielding unit 701 may transfer a signal or supply a power supply voltage. If an interconnection line also functions as the shielding unit 701 in this manner, it is desirable that the interconnection line be configured so as to include a material having a soft X-ray shielding performance higher than that of a material of another interconnection line. Alternatively, it is desirable that the thickness of the interconnection line that also functions as the shielding unit 701 be greater than the thickness of another interconnection line.

The advantage of the shielding unit 701 is described below with reference to FIGS. 12A to 12C. FIG. 12C illustrates a pixel unit according to the present exemplary embodiment. A shielding unit 1205 illustrated in FIG. 12C corresponds to the shielding unit 701 illustrated in FIG. 7. The shielding unit 1205 has an opening 1204 at a position corresponding to the first region 1201.

Detection of soft X-ray radiation is performed using the soft X-ray detection apparatus 1000 times. In this case, soft X-ray radiation is incident in the first region 1201 about 100 times. The incidence of soft X-ray radiation is not detected about 900 times. This is because soft X-ray radiation that can be incident in a region other than the first region 1201 is blocked by the shielding unit 1205. As a result, the probability of a signal being output is reduced. However, almost all of the output signals accurately indicate the energy of the incident soft X-ray. Accordingly, the energy of the soft X-ray can be accurately measured.

In FIG. 12C, the entirety of the second region 1202 is covered by the shielding unit 1205. In such a structure, the advantage of embodiments of the present invention can be increased. However, part of the second region 1202 need not be surrounded by the shielding unit 1205. For example, even when the conversion unit 3, which is part of the second region 1202, is not covered by the shielding unit 1205, the advantage of embodiments of the present invention can be provided. This is because if soft X-ray radiation is incident at a position near the middle point of the conversion unit 3, which is part of the second region 1202, almost all of the generated electrons are collected by the conversion unit 3 and, therefore, the electrons can be read in the form of a signal. The measurement result differs from the actual energy of the incident soft X-ray by the discharged number of electrons. However, if the error is within the allowable range, part of the electric charge may be allowed to be discharged. That is, a region in which the shielding unit 1205 is disposed can be appropriately selected in accordance with a performance required for the soft X-ray detection apparatus. Note that the shielding unit 1205 need not be disposed at a position which the third region 1203 overlaps.

As a comparative example used for describing the advantage of the shielding unit 701, a soft X-ray detection apparatus in which soft X-ray radiation is uniformly emitted to the entirety of the surface of the semiconductor substrate 2 is discussed. The soft X-ray detection apparatus serving as a comparative example outputs a signal based on a soft X-ray 801 incident on the conversion unit 3 (i.e., a signal accurately indicating the energy of the soft X-ray) and a signal based on a soft X-ray 803 incident on the circuit unit 4 (i.e., a signal not accurately indicating the energy of the soft X-ray). The statistical ratio of the number of the signals based on soft X-ray 801 to the number of the signals based on the soft X-ray 803 is determined by the area ratio of the conversion unit 3 to the circuit unit 4 and the layout of the conversion unit 3 and the circuit unit 4. For a soft X-ray detection apparatus in which the amplifier transistor 6 is disposed in each of the detection units, it is difficult to make the area of the circuit unit 4 zero. In addition, as described above, it is difficult to determine, from the output signal, whether the output signal is based on the soft X-ray 801 incident on the conversion unit 3 or the soft X-ray 803 incident on the circuit unit 4.

In summary, the soft X-ray detection apparatus may output a signal that accurately indicates the information regarding the soft X-ray and a signal that does not accurately indicate the information regarding the soft X-ray in accordance with a position at which the soft X-ray is incident. According to the structure of the present exemplary embodiment, the percentage of output signals that accurately indicate the information regarding the soft X-ray can be increased. As a result, the soft X-ray can be more accurately detected.

In addition, by forming the shielding unit 701 using a material having a shielding coefficient that is higher than those of aluminum and copper, the soft X-ray can be accurately detected. Furthermore, if the material has an atomic number of 70 or higher, the material has a shielding coefficient that is sufficient as the shielding coefficient of the shielding unit 701. Accordingly, by forming the shielding unit 701 using a material having an atomic number of 70 or higher, the soft X-ray can be more accurately detected.

Note that in FIG. 7, a layout that is the same as that of FIG. 1 is illustrated. However, the shielding unit 701 can be applied to the second exemplary embodiment (refer to FIG. 5) and the third embodiment (refer to FIG. 6).

Fifth Exemplary Embodiment

Figure 9:
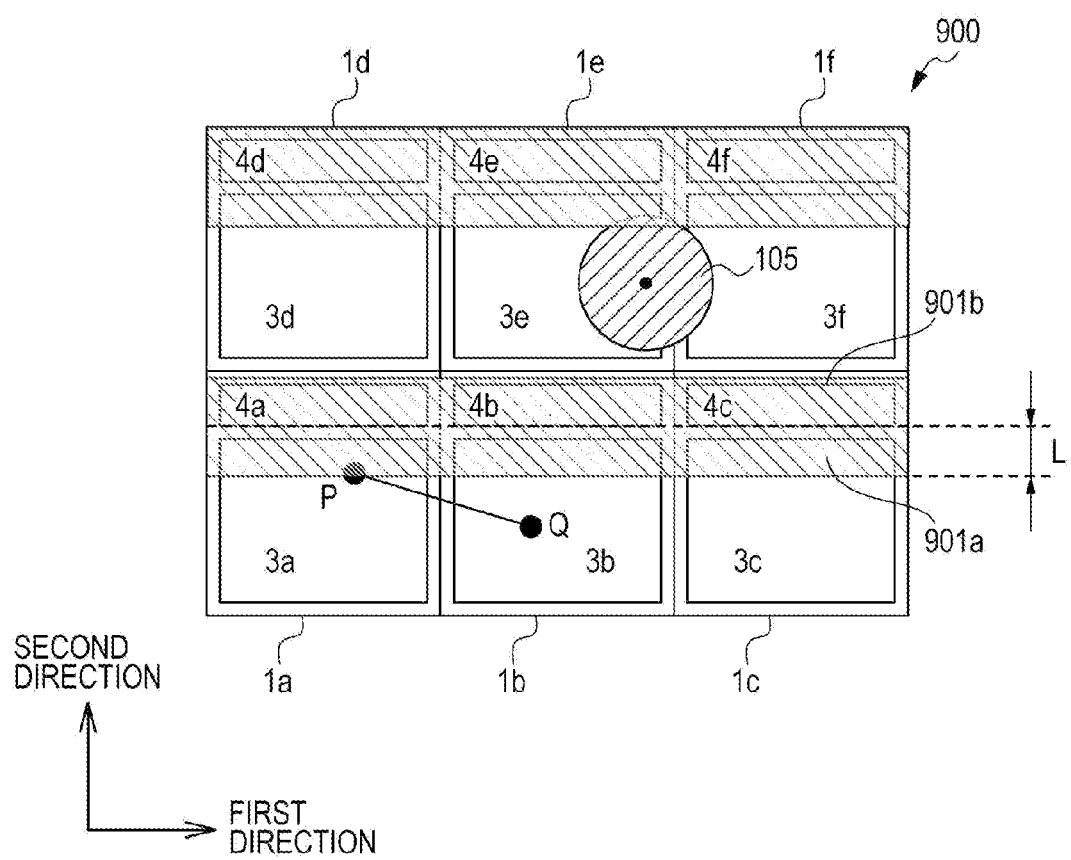
FIG. 9 is a schematic illustration of the planar structure of a soft X-ray detection apparatus according to a fifth exemplary embodiment of the present invention.

A soft X-ray detection apparatus 900 according to a fifth exemplary embodiment of the present invention is described below. FIG. 9 is a schematic illustration of the planar structure of a detection unit 1 of the soft X-ray detection apparatus 900. The same reference symbol is used to indicate elements in FIG. 9 and FIG. 7 (the fourth exemplary embodiment) which perform the same or a similar function, and detailed descriptions of the elements are not repeated. The fifth exemplary embodiment differs from the fourth exemplary embodiment in terms of the layout of a shielding unit 901. Only the elements that differ from the elements of the fourth exemplary embodiment are described below. The element that is not described can be the same as that of the fourth embodiment.

According to the fifth exemplary embodiment, part of the shielding unit 901 is disposed above the conversion unit 3. In the following description, a portion of the shielding unit 901 that is located above the conversion unit 3 is referred to as a "first portion 901*a*", and a portion of the shielding unit 901 that is located above the circuit unit 4 is referred to as a "second portion 901*b*".

The first portion 901*a* is disposed above a region of the conversion unit 3 that is close to the circuit unit 4. The first portion 901*a* and the second portion 901*b* may be continuous. That is, the shielding unit 901 formed as a single layer may extend above a region extending from the circuit unit 4 to the conversion unit 3. Since, in plan view, a region where the conversion unit 3 or the circuit unit 4 is exposed between the first portion 901*a* and the second portion 901*b* can be eliminated, the shielding performance can be increased.

Alternatively, the first portion 901*a* and the second portion 901*b* may be formed as different layers. That is, the distance between the surface of the semiconductor substrate 2 and the first portion 901*a* can differ from the distance between the surface of the semiconductor substrate 2 and the second portion 901*b*. In this case, the first portion 901*a* and the second portion 901*b* may extend so as to overlap each other. Since, in plan view, a region where the conversion unit 3 or the circuit unit 4 is exposed between the first portion 901*a* and the second portion 901*b* can be eliminated, the shielding performance can be increased.

Alternatively, a connecting portion of the first portion 901*a* and the second portion 901*b* formed as different layers may be included in the shielding unit 901. In this way, even when the first portion 901*a* and the second portion 901*b* do not overlap each other, the shielding performance can be increased. However, the first portion 901*a* may be separated from the second portion 901*b*.

As illustrated in FIG. 9, a region of the conversion unit 3 within a third distance L from the boundary between the conversion unit 3 and the circuit unit 4 may be completely covered by the first portion 901*a*. Alternatively, a region within the third distance L from the region of the circuit unit 4 in which the transistor is disposed may be completely covered by the first portion 901*a*.

The shielding unit 901 need not be disposed above a region of the conversion unit 3 the third distance L or more away from the boundary. However, the first portion 901*a* of the shielding unit 901 may be disposed above part of the region.

An advantage of the present exemplary embodiment is described next. According to the present exemplary embodiment, the first portion 901*a* of the shielding unit 901 is disposed in a region of the conversion unit 3 within the third distance L from the boundary between the conversion unit 3 and the circuit unit 4. In this way, soft X-ray radiation that is incident in the boundary region can be blocked. As a result, the probability of the soft X-ray being incident at a position at which the charge generation region extends to the circuit unit can be reduced. Since the percentage of output signals that do not accurately indicate the energy of the incident soft X-ray is reduced, the soft X-ray can be more accurately detected.

Furthermore, if the first portion 901a is disposed over the entirety of a region of the conversion unit 3 within the third distance L from the boundary between the conversion unit 3 and the circuit unit 4, almost all of the electrons generated by a soft X-ray 602 incident on the conversion unit 3 can be collected. That is, the percentage of output signals that do not accurately indicate the energy of the soft X-ray can be further reduced. By disposing the shielding unit 901 over the conversion unit 3 in this manner, the soft X-ray can be more accurately detected.

The third distance L can be determined as needed. For example, the third distance L can be determined in accordance with the size of the charge generation region determined when the soft X-ray to be detected is incident on the semiconductor substrate 2. If the third distance L is greater than the average radius of the charge generation regions, it is likely to provide a high shielding performance. More specifically, the third distance L can be determined so as to be greater than the radius of the smallest imaginary sphere that encloses the charge generation region.

Alternatively, the third distance L may be determined on the basis of the size of the conversion unit 3. If the third distance L is reduced relative to the size of the conversion unit 3, the sensitivity is not decreased. As the third distance L is increased more, the performance of preventing discharge of an electron to the circuit unit 4 becomes higher. However, at the same time, the probability of the soft X-ray being incident on the conversion unit 3 is decreased. That is, there is a tradeoff between the sensitivity and the accuracy of soft X-ray detection. Accordingly, the third distance L is appropriately determined in accordance with the required performance. For example, when the energy of soft X-ray radiation to be detected is less than or equal to 10 KeV and if the size of the detection unit is about 10 micrometer, the third distance L can be in the range from 0.1 micrometer to 2.0 micrometer. However, if necessary, the third distance L can be outside this range.

Alternatively, the third distance L (micrometer) may be determined as follows:

$$L = 0.85 \times E^{\frac{7}{4}} \times 10^{-2} \quad (3)$$

where E (keV) denotes the energy of the incident soft X-ray.

Note that the shielding unit 901 need not be disposed over a region of the conversion unit 3 within the third distance L from the boundary. A region of the conversion unit 3 having the first portion 901a disposed thereabove can be changed as needed.

According to the present exemplary embodiment, the shielding unit 901 is disposed so as to overlap the N-type semiconductor region 11. However, as described in the modification of the first exemplary embodiment, a portion of the P-type semiconductor region that is immediately adjacent to the N-type semiconductor region 11 in the planar direction and that generates a depletion layer may be part of the conversion unit 3. In such a case, the shielding unit 901 can be disposed so as to overlap the region within the third distance L without disposing the shielding unit 901 so that the shielding unit 901 overlaps the N-type semiconductor region 11.

The equivalent circuit, the planar structure, and the cross-sectional structure of the detection unit 1 according to the present exemplary embodiment can be the same as those of the first to third embodiments. In addition, the modification described in the first exemplary embodiment is applicable to the present exemplary embodiment.

Sixth Exemplary Embodiment

Figure 10:
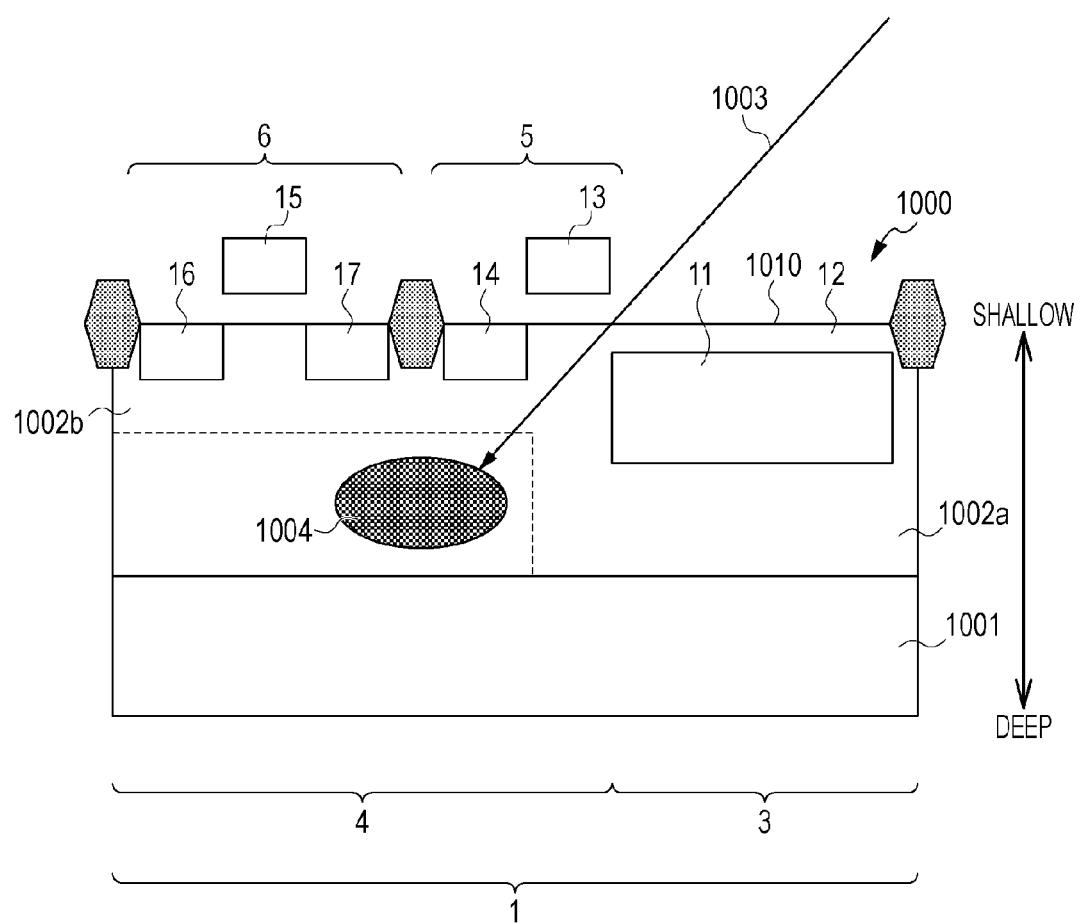
FIG. 10 is a schematic cross-sectional view of a soft X-ray detection apparatus according to a sixth exemplary embodiment of the present invention.

A soft X-ray detection apparatus 1000 according to a sixth exemplary embodiment of the present invention is described below. FIG. 10 is a schematic cross-sectional view of a detection unit 1 of the soft X-ray detection apparatus 1000. The same reference symbol is used to indicate elements in FIG. 10 and FIG. 2 (the first exemplary embodiment) which perform the same or a similar function, and detailed descriptions of the elements are not repeated. The planar structure of the detection unit 1 of the sixth exemplary embodiment is the same as, for example, that of the first exemplary embodiment. FIG. 10 corresponds to a cross-sectional view taken along the line II-II of FIG. 1.

According to the sixth exemplary embodiment, the internal structure of a semiconductor substrate 1001 differs from that of the first to fifth exemplary embodiments. Hereinafter, only a structure that differs from that of the first to fifth exemplary embodiments is described. The structure that is not described can be the same as that of any one of the first to fifth exemplary embodiments.

According to the present exemplary embodiment, the semiconductor substrate 1001 is an N-type semiconductor substrate. A P-type well 1002 is disposed in the semiconductor substrate 1001. The P-type well 1002 includes a first well 1002a disposed in the conversion unit 3 and a second well 1002b disposed in the circuit unit 4. The N-type semiconductor region 11 and the P-type semiconductor region 12 that form the conversion unit 3 are disposed inside the first well 1002a. The N-type semiconductor region 11 and the first well 1002a form a P-N junction. That is, the P-type semiconductor region 12, the N-type semiconductor region 11, and the first well 1002a form a buried type photodiode. The semiconductor regions of the transfer transistor 5 and the amplifier transistor 6 are disposed in the second well 1002b. Note that while, for simplicity, description has been made with reference to two wells (i.e., the first well 1002a and the second well 1002b), the two wells may serve as a single semiconductor region in reality. However, two semiconductor regions may correspond to the first well 1002a and the second well 1002b.

A first feature of the present exemplary embodiment is characterized in that an N-type semiconductor region (the semiconductor substrate 1001) having an opposite conductive type is disposed under the P-type well 1002 having the semiconductor regions disposed therein. A second feature is characterized in that the lower end of the first well 1002a is deeper than the lower end of the second well 1002b. As used herein, a reference depth is the level of a principal surface 1010 adjacent to the transfer gate electrode 13 and the gate electrode 15 of the amplifier transistor 6. As a level inside the semiconductor substrate is nearer to the principal surface 1010, the level is shallower. In contrast, as a level inside the semiconductor substrate is farther from the principal surface 1010, the level is deeper. In terms of a vertically-structured relationship inside the semiconductor substrate, if a first component that is closer to the principal surface 1010 than a second component, the first component is located above the second component. In contrast, if a first component that is farther from the principal surface 1010 than a second component, the first component is located under the second component. In addition, the lower end of the semiconductor region can be defined as a P-N junction interface of the P-type well 1002 and the semiconductor substrate 1001.

A method for producing the P-type well 1002 having such a structure is briefly described next. An N-type semiconductor substrate 1001 is prepared first. Subsequently, a first mask having an opening at a position corresponding to the first well 1002a is formed. The first well 1002a is formed by ion injection using the first mask. Thereafter, a second mask having an opening at a position corresponding to the second well 1002b is formed. The second well 1002b is formed by ion injection using the second mask. By varying the energy of ion injection, the first well 1002a and the second well 1002b having their lower ends at different depths can be formed.

Another method for producing the P-type well 1002 is described below. An N-type semiconductor substrate 1001 is prepared, and a P-type semiconductor region having a uniform depth is formed throughout a region in which the P-type well 1002 is disposed. Subsequently, the P-type semiconductor region is formed, using ion injection, in only a region corresponding to the first well 1002a at a level deeper than the level of the P-type semiconductor region previously formed. Alternatively, N-type counter impurities (donors) may be ion-injected to only a region corresponding to the second well 1002b. Note that the above-described methods are only examples. Another known method may be employed in order to form the P-type well 1002.

An advantage of the present exemplary embodiment is described next. According to the present exemplary embodiment, the N-type semiconductor substrate 1001 is disposed under the P-type well 1002. Accordingly, a potential gradient is formed in the border between the P-type well 1002 and the semiconductor substrate 1001 so that an electron travels from the P-type well 1002 to the semiconductor substrate 1001. That is, the P-type well 1002 can function as a potential barrier for an electron in the semiconductor substrate 1001.

Although the circuit unit 4 is covered by the shielding unit 701, a plurality of electrons may be generated in the circuit unit 4 by, for example, a soft X-ray 1003 that is diagonally incident on the circuit unit 4. That is, although the circuit unit 4 is covered by the shielding unit 701, a region in the vicinity of the circuit unit 4 may be included in a charge generation region 1004. According to the structure of the present exemplary embodiment, the probability of an electron generated at a point in the vicinity of the lower end of the second well 1002b or a point that is deeper than the lower end of the second well 1002b being collected by the conversion unit 3 is low due to the potential barrier. In addition, the lower end of the second well 1002b of the circuit unit 4 is located at a shallow level. Therefore, an electron generated in a region that is shallower than the lower end of the second well 1002b of the circuit unit 4 tends to be discharged to, for example, the power supply unit located in the vicinity. That is, an electron generated in the circuit unit 4 is easily discharged to, for example, the power supply unit without being collected by the conversion unit 3. In contrast, in the conversion unit 3, the lower end of the first well 1002a is located at a deep level. Accordingly, an electron generated in the conversion unit 3 is negligibly discharged to the semiconductor substrate 1001.

As described above, if some of the generated electrons are collected by the conversion unit 3 and the other electrons are discharged to a region other than the conversion unit 3, a signal that does not accurately indicate the energy of the soft X-ray may be output. By reading all of the generated electrons or discharging all of the generated electrons, a signal that accurately indicates the energy of the soft X-ray can be obtained. According to the structure of the present exemplary embodiment, if soft X-ray radiation is incident on the conversion unit 3, the probability of all of the generated electrons being collected by the conversion unit 3 can be increased. In addition, if soft X-ray radiation is incident on the circuit unit 4, the probability of all of the generated electrons being discharged can be increased. As a result, the soft X-ray can be more accurately detected.

Note that the equivalent circuit and the planar structure of the detection unit 1 according to the present exemplary embodiment can be the same as those of the detection unit 1 according to any one of the first to fifth exemplary embodiments. In addition, the modification described in the first exemplary embodiment is applicable to the detection unit 1.

Seventh Exemplary Embodiment

Figure 13:
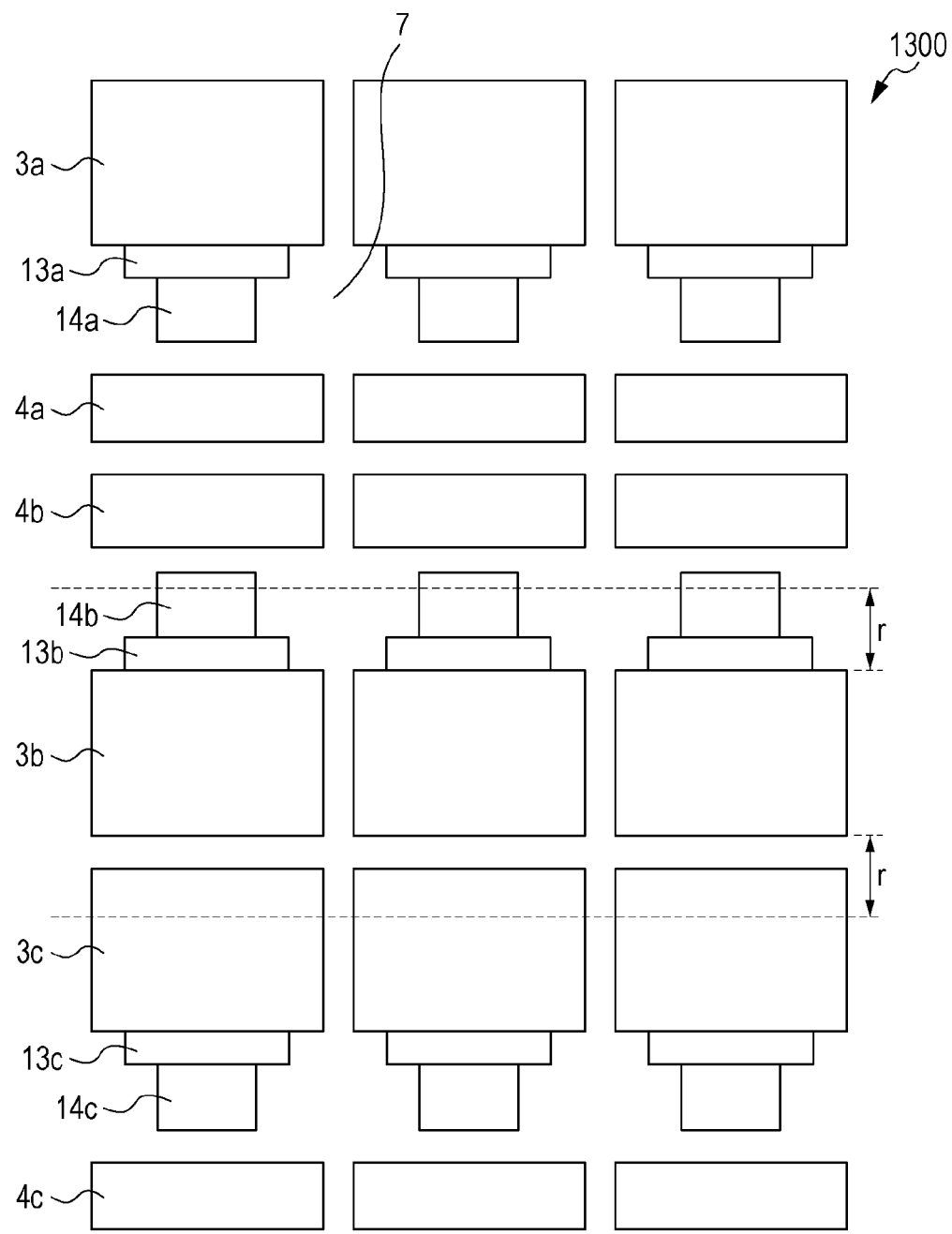
FIG. 13 is a schematic cross-sectional view of a soft X-ray detection apparatus according to a seventh exemplary embodiment of the present invention.

A soft X-ray detection apparatus 1300 according to a seventh exemplary embodiment of the present invention is described below. FIG. 13 is a schematic illustration of the planar structure of a detection unit of the soft X-ray detection apparatus 1300. The same reference symbol is used to indicate elements in the seventh exemplary embodiment and any one of the first to sixth exemplary embodiments which perform the same or a similar function, and detailed descriptions of the elements are not repeated.

The feature of the present exemplary embodiment is characterized in that a conversion unit 3 included in a first detection unit is disposed so that the distance between the conversion unit 3 and a first conductive type transistor included in a circuit unit 4 of a second detection unit that is immediately adjacent to the first detection unit is greater than the second distance r.

Nine detection units arranged in a matrix of three rows and three columns are illustrated in FIG. 13. Each of the detection units includes the conversion unit 3, the circuit unit 4, the transfer gate electrode 13, and the FD 14. The circuit unit 4 has a first conductive type transistor, such as an amplifier transistor, disposed therein. In addition, the circuit unit 4 has an isolation unit 7 that electrically separates transistors included in the conversion unit 3 and the circuit unit 4 from one another.

As illustrated in FIG. 13, the conversion unit 3b included in the detection unit 1b is disposed so that the distance between the conversion unit 3b and a first conductive type transistor disposed in a circuit unit 4a of a detection unit 1a that is immediately adjacent to the detection unit 1b is greater than the second distance r. In addition, the conversion unit 3b is disposed so that the distance between the conversion unit 3b and a first conductive type transistor disposed in a circuit unit 4c of the detection unit 1c that is also immediately adjacent to the detection unit 1b is greater than the second distance r.

For example, the second distance r can be determined so as to be equal to the radius of the smallest sphere that encloses the charge generation region. Alternatively, if the semiconductor substrate 2 is a silicon substrate, the second distance r can be determined so as to be 0.5 micrometer. Still alternatively, the second distance r (micrometer) may be determined as follows:

$$r = 0.85 \times E^{\frac{7}{4}} \times 10^{-2} \qquad (4)$$

where E (keV) denotes the energy of the incident soft X-ray. Note that equation (4) is the same as equation (2).

The detection units 1 may include a transfer transistor. According to the present exemplary embodiment, the transfer gate electrode 13 and the FD 14 form the transfer transistor. The circuit unit 4 has transistors other than the transfer transistor. That is, the conversion unit 3 may be disposed so that the distance between the conversion unit 3 and every first conductive type transistor other than the transfer transistor included in the same detection unit is greater than the second distance r. Alternatively, according to the present exemplary embodiment, the conversion unit 3b may be disposed so that the distance between the conversion unit 3b and every first conductive type transistor included in a circuit unit 4b of the detection unit 1b is greater than the second distance r.

As described above, the conversion unit 3 is disposed so as to be separated from the first conductive type transistor that can function as the discharge portion of electric charge. According to such a structure, the area of a portion of the conversion unit 3 that functions as the discharge region can be reduced. Accordingly, the probability of part of the generated electric charge being discharged can be reduced and, therefore, the soft X-ray can be more accurately detected.

Furthermore, a shielding unit may be provided so as to overlap a region between the conversion unit 3 and the circuit unit 4 in the same detection unit. According to such a structure, the soft X-ray can be further accurately detected.

Note that the equivalent circuit and the planar structure of the detection unit 1 according to the present exemplary embodiment can be the same as those of the detection unit 1 according to any one of the first to sixth exemplary embodiments. In addition, the modification described in the first exemplary embodiment is applicable to the detection unit 1.

Eighth Exemplary Embodiment

Figure 14:
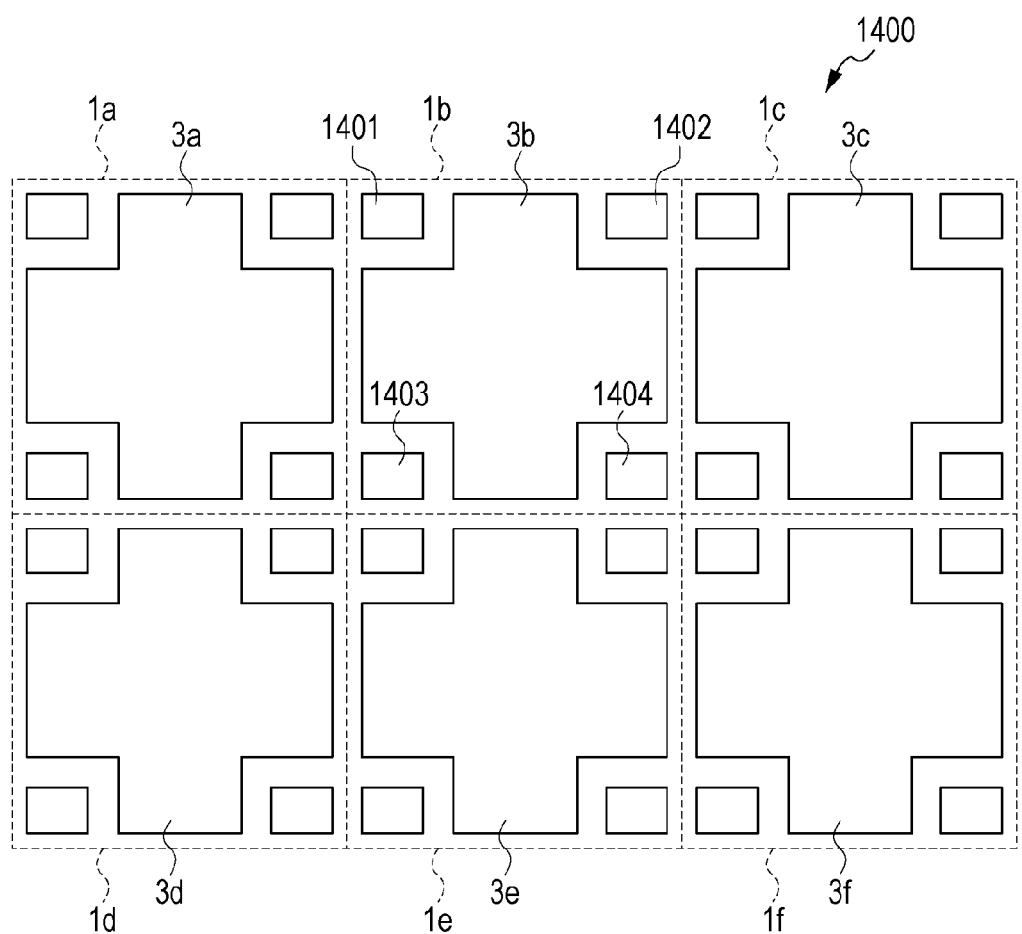
FIG. 14 is a schematic cross-sectional view of a soft X-ray detection apparatus according to an eighth exemplary embodiment of the present invention.

A soft X-ray detection apparatus 1400 according to an eighth exemplary embodiment of the present invention is described below. FIG. 14 is a schematic illustration of the planar structure of a detection unit of the soft X-ray detection apparatus 1400. The same reference symbol is used to indicate elements in the eighth exemplary embodiment and any one of the first to seventh exemplary embodiments which perform the same or a similar function, and detailed descriptions of the elements are not repeated.

According to the present exemplary embodiment, a first conductive type transistor is disposed between every pair of the conversion units 3 that are immediately adjacent to each other. The feature of the present exemplary embodiment is characterized in that such a transistor is disposed so as to be in close proximity to the transistor in a detection unit that is immediately adjacent to the detection unit.

Six detection units 1a, 1b, 1c, 1d, 1e and 1f with corresponding six conversion units 3a, 3b, 3c, 3d, 3e and 3f are illustrated in FIG. 14. The planar structure of the detection unit of the present exemplary embodiment is described with reference to the detection unit 1b. The detection unit 1b includes a conversion unit 3b and circuit units 1401, 1402, 1403 and 1404. The conversion unit 3b includes a first conductive type semiconductor region. In addition, each of the circuit units 1401 to 1404 includes a first conductive type transistor.

A positional relationship between the transistor included in each of the circuit units 1401 to 1404 and the transistor included in an adjacent detection unit is described next. The transistor included in the circuit unit 1401 and the transistor included in the adjacent detection unit 1a are disposed so that the distance therebetween is less than the first distance d. In addition, the transistor included in the circuit unit 1401 and a transistor included in an adjacent detection unit (not illustrated) may be disposed so that the distance therebetween is less than the first distance d.

Similarly, the transistor included in the circuit unit 1402 and the transistor included in the adjacent detection unit 1c are disposed so that the distance therebetween is less than the first distance d. In addition, the transistor included in the circuit unit 1402 and a transistor included in an adjacent detection unit (not illustrated) may be disposed so that the distance therebetween is less than the first distance d.

The transistor included in the circuit unit 1403 and the transistor included in the adjacent detection unit 1a are disposed so that the distance therebetween is less than the first distance d. In addition, the transistor included in the circuit unit 1403 and the transistor included in the adjacent detection unit 1e are disposed so that the distance therebetween is less than the first distance d.

The transistor included in the circuit unit 1404 and the transistor included in the adjacent detection unit 1c are disposed so that the distance therebetween is less than the first distance d. In addition, the transistor included in the circuit unit 1404 and the transistor included in the adjacent detection unit 1e are disposed so that the distance therebetween is less than the first distance d.

Each of the circuit units 1401 to 1404 is disposed between two conversion units 3. In this way, according to the present exemplary embodiment, the distance between each of the transistors disposed between the conversion units and the transistor of the adjacent detection unit is less than the first distance d.

The first distance d is determined on the basis of the size of a region in which an electron is generated when a photon of the soft X-ray is incident on the semiconductor substrate. For example, the first distance d can be determined so as to be equal to the diameter of the smallest sphere that encloses the region in which an electron is generated when a photon of the soft X-ray is incident on the semiconductor substrate. Alternatively, if the semiconductor substrate 2 is a silicon substrate, the first distance d can be determined so as to be 1 micrometer. Still alternatively, the first distance d (micrometer) may be determined as follows:

$$d = 1.71 \times E^{\frac{7}{4}} \times 10^{-2} \qquad (5)$$

where E (keV) denotes the energy of the incident soft X-ray. Note that equation (5) is the same as equation (1).

Note that in FIG. 14, a first conductive type transistor is disposed between the conversion unit 3b and every conversion unit 3 that is immediately adjacent to the conversion unit 3b. However, as illustrated in FIGS. 1, 5, and 6, the first conductive type transistor need not be disposed between the conversion units 3 that are immediately adjacent to each other.

As illustrated in FIG. 14, in the soft X-ray detection apparatus 1400 according to the present exemplary embodiment, the detection units 1a and 1b are disposed so as to be immediately adjacent to each other. The first conductive type transistor included in the detection unit 1a and the first conductive type transistor included in the detection unit 1b are disposed so that the distance therebetween is less than the first distance d. According to such a structure, the area of the discharge region (a region corresponding to the second region 1202 illustrated in FIG. 12B) can be reduced. Accordingly, the probability of the electric charge being discharged can be reduced and, therefore, the soft X-ray can be more accurately detected.

The equivalent circuit and the cross-sectional structure of the detection unit 1 according to the present exemplary embodiment can be the same as those of the first to seventh embodiments. In addition, the modification described in the first exemplary embodiment is applicable to the present exemplary embodiment.

Ninth Exemplary Embodiment

Figure 11:
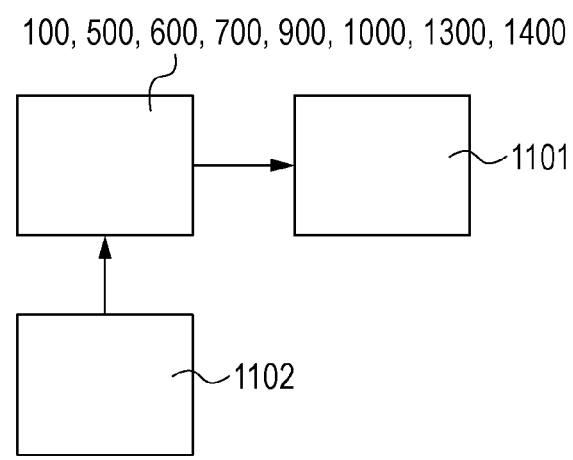
FIG. 11 is a block diagram of a soft X-ray detection system according to a ninth exemplary embodiment of the present invention.

An exemplary embodiment of a soft X-ray detection system including the soft X-ray detection apparatus according to the above-described exemplary embodiment is described below with reference to FIG. 11. According to the present exemplary embodiment, the soft X-ray detection system includes any one of the soft X-ray detection apparatuses 100, 500, 600, 700, 900, 1000, and 1300 according to the first to seventh exemplary embodiments, respectively. The soft X-ray detection system further includes a signal processing circuit 1101 that processes a signal output from the soft X-ray detection apparatus and a drive circuit 1102 that drives the soft X-ray detection apparatus. A well-known circuit applicable to the solid-state image pickup device can be used as each of the signal processing circuit 1101 and the drive circuit 1102. Part or the entirety of the signal processing circuit 1101 and part or the entirety of the drive circuit 1102 may be disposed on a single semiconductor substrate. Alternatively, the signal processing circuit 1101 or the drive circuit 1102 is disposed on a semiconductor substrate different from the semiconductor substrate of the soft X-ray detection apparatus.

In addition, the soft X-ray detection system may include a propulsion device. For example, the propulsion device controls the position of the soft X-ray detection system in satellite orbit. Alternatively, the propulsion device may be a rocket engine that moves the soft X-ray detection system from the surface of the earth into satellite orbit. The propulsion device may be configured to be removable.

An example of a method for driving the soft X-ray detection system is described next. In order to measure the energy of soft X-ray radiation, the drive circuit 1102 drives the soft X-ray detection apparatus so that the average number of photons incident on one of the detection units during one accumulation period is less than one. That is, a sufficiently short accumulation period can be set on the basis of the amount of the incident soft X-ray radiation. More specifically, the amount of soft X-ray radiation can be expressed as the number of photons emitted per unit area and per unit time. Accordingly, if the number of photons emitted to one of the detection units per unit time is computed using the area of the detection unit, the accumulation period can be determined. Thereafter, after one accumulating operation is performed, the soft X-ray detection apparatus outputs a signal carrier in the form of a signal, and the signal processing circuit 1101 generates an image. The image can be generated by mapping the energy of the soft X-ray incident on each of the detection units to a two-dimensional plane.

In addition, in order to detect the amount (the strength) of the incident soft X-ray, that is, in order to detect the number of photons, the above-described accumulating operation can be repeatedly performed multiple times, and a signal can be read each time the accumulating operation is performed. For example, if the soft X-ray emitted from the sun is detected on a satellite orbit of the earth, several hundred photons may be incident on one of the detection units of the soft X-ray detection apparatus per second. In order to measure the number and the energy of photons, several hundred to several thousand images need to be captured and read per second. In order to read the images at high speed using a CCD soft X-ray detection apparatus, the number of the detection units need to be decreased and, thus, the resolution of the image need to be reduced. In contrast, since the soft X-ray detection apparatus according to the present exemplary embodiment has an amplifier unit in each of the detection units, high-speed image capturing can be performed without sacrificing the resolution of the image.

While exemplary embodiments of the present invention have been described, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-171972 filed Aug. 5, 2011, which is hereby incorporated by reference herein in its entirety.

What is claimed is:

1. A detection apparatus configured to detect soft X-ray radiation, comprising:
    a semiconductor substrate; and
    a plurality of detection units disposed on the semiconductor substrate; and
    a shielding unit configured to reduce an amount of soft X-ray radiation incident on the semiconductor substrate, wherein each detection unit includes:
        a first conductive type semiconductor region disposed in the semiconductor substrate and configured to collect electric charge generated upon incidence of soft X-ray radiation, and
        a readout circuit including one or more first conductive type transistors and one floating diffusion node, the first conductive type transistors including at least an amplifier transistor configured to output a signal based on the electric charge collected by the first conductive type semiconductor region and transferred to the floating diffusion node;
    wherein any one of the first conductive type transistors included in the readout circuit is not disposed between a pair of the semiconductor regions that are adjacent to each other,
    wherein a first isolation unit is disposed between the pair of the semiconductor regions so that the two semiconductor regions are electrically separated from each other, and
    wherein the shielding unit is disposed so as to overlap at least part of the readout circuit of each detection unit.

2. The detection apparatus according to claim 1,
    wherein at least three of the semiconductor regions, respectively included in first, second and third detection units of the plurality of detection units, are arranged along a first direction,
    wherein any one of the first conductive type transistors included in the readout circuit is not disposed between every pair of the at least three of the semiconductor regions,
    wherein the first isolation unit is disposed between every pair of the at least three of the semiconductor regions so that the at least three of the semiconductor regions are electrically separated from one other,
    wherein one of the at least three of the semiconductor regions is disposed between the semiconductor region included in a fourth detection unit and the semiconductor region included in a fifth detection unit, and is adjacent to both of the semiconductor regions included in the fourth and fifth detection units,
    wherein a first conductive type transistor included in the readout circuit is disposed between the one of the at least three of the semiconductor regions and the semiconductor region included in the fourth detection unit, and wherein another first conductive type transistor included in the readout circuit is disposed between the one of the at least three of semiconductor regions and the semiconductor region included in the fifth detection unit.

3. The detection apparatus according to claim 1,
wherein at least three of the semiconductor regions, respectively included in first, second and third detection units of the plurality of detection units, are arranged along a first direction,
wherein any one of the first conductive type transistors included in the readout circuit is not disposed between every pair of the at least three of the semiconductor regions,
wherein the first isolation unit is disposed between every pair of the at least three of the semiconductor regions so that the at least three of the semiconductor regions are electrically separated from one other,
wherein one of the at least three of the semiconductor regions is disposed between the semiconductor region included in a fourth detection unit and the semiconductor region included in a fifth detection unit, and is adjacent to both of the semiconductor regions included in the fourth and fifth detection units,
wherein a first conductive type transistor included in the readout circuit is disposed between the one of the at least three of the semiconductor regions and the semiconductor region included in the fourth detection unit,
wherein any one of the first conductive type transistors included in the readout circuit is not disposed between the one of the at least three of semiconductor regions and the semiconductor region included in the fifth detection unit, and
wherein a second isolation unit is disposed between the one of the at least three of semiconductor regions and the semiconductor region included in the fifth detection unit so that the one of the at least three of semiconductor regions and the semiconductor region included in the fifth detection unit are electrically separated from each other.

4. The detection apparatus according to claim 3, wherein the semiconductor region included in the fourth detection unit, the one of the at least three of the semiconductor regions, and the semiconductor region included in the fifth detection unit are arranged in a second direction that intersects the first direction.

5. The detection apparatus according to claim 1,
wherein four of the semiconductor regions, respectively included in first, second, third and fourth detection units of the plurality of detection units, form a block,
wherein the first semiconductor region included in the first detection unit and the semiconductor region included in the second detection unit are arranged along a first direction,
wherein the semiconductor region included in the third detection unit and the semiconductor region included in fourth detection unit are arranged along a third direction parallel to the first direction,
wherein the semiconductor region included in the first detection unit and the semiconductor region included in the third detection unit are arranged along a second direction that intersects the first direction,
wherein the semiconductor region included in the second detection unit and the semiconductor region included in the fourth detection unit are arranged along a fourth direction parallel to the second direction,
wherein any one of the first conductive type transistor included in the readout circuit is not disposed between every adjacent two of the four semiconductor regions forming the block,
wherein the first isolation unit is disposed between every adjacent two of the four semiconductor regions forming the block so that the four semiconductor regions forming the block are electrically separated from one another, and
wherein a first conductive type transistor included in the readout circuit is disposed between one of the four semiconductor regions forming the block and the semiconductor region included in a fifth detection unit.

6. The detection apparatus according to claim 1, further comprising:
wherein the shielding unit is disposed so that at least part of a projection of the shielding unit onto the semiconductor substrate overlaps at least part of the first conductive type transistors.

7. The detection apparatus according to claim 6, wherein the semiconductor region functions as a conversion unit that converts the soft X-ray radiation into the electric charge, and wherein the shielding unit is disposed so that another part of the shielding unit projected onto the semiconductor substrate overlaps the entirety or part of the semiconductor region within a third distance away from each of the transistors, and wherein the third distance is set to a value L defined by the following equation:

$$L = 0.85 \times E^{\frac{7}{4}} \times 10^{-2}$$

where E denotes an energy of the soft X-ray radiation in keV.

8. A detection system configured to detect soft X-ray radiation, comprising:
the detection apparatus according to claim 1; and
a signal processing circuit configured to process a signal output from the detection apparatus;
wherein the signal processing circuit calculates an energy of the soft X-ray radiation incident on the semiconductor substrate on the basis of the signal.

9. A detection apparatus configured to detect soft X-ray radiation, comprising:
a semiconductor substrate;
first and second detection units disposed on the semiconductor substrate; and
a shielding unit configured to reduce an amount of soft X-ray radiation incident on the semiconductor substrate,
wherein each of the first and second detection units includes:
a first conductive type semiconductor region disposed in the semiconductor substrate and configured to collect electric charge generated upon incidence of soft X-ray radiation,
one floating diffusion node, and
a plurality of first conductive type transistors including an amplifier transistor configured to output a signal based on the electric charge collected by the semiconductor region and transferred to the floating diffusion node;
wherein the first detection unit and the second detection unit are disposed so as to be adjacent to each other,
wherein any one of the first conductive type transistors included in the first detection unit and any one of the first conductive type transistors included in the second detection unit are disposed so that a distance therebetween is less than a first distance, and wherein the shielding unit is disposed so as to overlap at least part of the plurality of first conductive type transistors and the floating diffusion node of each detection unit.

10. The detection apparatus according to claim 9, wherein the first distance is a diameter of the smallest sphere that encloses a region in which the electric charge is generated when a photon of the soft X-ray radiation is incident on the semiconductor substrate.

11. The detection apparatus according to claim 9, wherein the first distance is set to a value d defined by the following equation:

$$d = 1.71 \times E^{\frac{7}{4}} \times 10^{-2}$$

where E denotes an energy of the soft X-ray radiation in thousands of electronvolts (keV).

12. The detection apparatus according to claim 9, wherein the first distance is 1 micrometer.

13. A detection apparatus configured to detect soft X-ray radiation, comprising:
 a semiconductor substrate;
 first and second detection units disposed on the semiconductor substrate; and
 a shielding unit configured to reduce an amount of soft X-ray radiation incident on the semiconductor substrate,
 wherein each of the first and second detection units includes:
   a first conductive type semiconductor region disposed in the semiconductor substrate and configured to collect electric charge generated upon incidence of soft X-ray radiation,
   one floating diffusion node, and
   a plurality of first conductive type transistors including an amplifier transistor configured to output a signal based on the electric charge collected by the semiconductor region and transferred to the floating diffusion node;
 wherein the first detection unit and the second detection unit are disposed so as to be adjacent to each other,
 wherein the semiconductor region included in the first detection unit and the first conductive type transistors included in the second detection unit are disposed so that a distance between the semiconductor region included in the first detection unit and each of the first conductive type transistors included in the second detection unit is greater than a second distance, and
 wherein the shielding unit is disposed so as to overlap at least part of the plurality of first conductive type transistors and the floating diffusion node of each detection unit.

14. The detection apparatus according to claim 13, wherein the second distance is a radius of the smallest sphere that encloses a region in which the electric charge is generated when a photon of the soft X-ray radiation is incident on the semiconductor substrate.

15. The detection apparatus according to claim 13, wherein the second distance is set to a value r defined by the following equation:

$$r = 0.85 \times E^{\frac{7}{4}} \times 10^{-2}$$

where E denotes an energy of the soft X-ray radiation in thousands of electronvolts (keV).

16. The detection apparatus according to claim 13, wherein the second distance is 0.5 micrometer.

17. The detection apparatus according to claim 13, wherein the semiconductor region included in the first detection unit and the first conductive type transistors included in the first detection unit are disposed so that a distance between the semiconductor region included in the first detection unit and each of the first conductive type transistors included in the first detection unit other than a transfer transistor is greater than the second distance.

18. The detection apparatus according to claim 13, wherein a first isolation unit is disposed between the semiconductor region included in the first detection unit and the semiconductor region included in the second detection unit.

* * * * *